(12) United States Patent
Kusano et al.

(10) Patent No.: US 6,636,118 B1
(45) Date of Patent: Oct. 21, 2003

(54) HIGH-FREQUENCY POWER AMPLIFICATION MODULE AND RADIO COMMUNICATION DEVICE

(75) Inventors: Cyushiro Kusano, Niiza (JP); Eiichi Hase, Iruma (JP); Hideyuki Ono, Kokubunji (JP); Osamu Kagaya, Tokyo (JP); Yasunari Umemoto, Sayama (JP); Takahiro Fujita, Fussa (JP); Kiichi Yamashita, Tsukui (JP)

(73) Assignees: Hitachi, Ltd., Tokyo (JP); Hitachi ULSI Systems Co., Ltd., Tokyo (JP)

(*) Notice: Subject to any disclaimer, the term of this patent is extended or adjusted under 35 U.S.C. 154(b) by 0 days.

(21) Appl. No.: 09/914,678

(22) PCT Filed: Sep. 6, 1999

(86) PCT No.: PCT/JP99/04819
§ 371 (c)(1),
(2), (4) Date: Nov. 14, 2001

(87) PCT Pub. No.: WO01/18865
PCT Pub. Date: Mar. 15, 2001

(51) Int. Cl.[7] ............................ H03F 3/04; H03F 1/52; H03F 3/14; H03K 5/08
(52) U.S. Cl. ................... 330/298; 330/207 P; 330/307; 327/314; 327/325
(58) Field of Search ............................ 330/207 P, 298, 330/307; 327/314, 325

(56) References Cited

U.S. PATENT DOCUMENTS

| | | | |
|---|---|---|---|
| 3,681,659 A | * 8/1972 | Suzuki | 361/56 |
| 3,754,193 A | * 8/1973 | Reinhard | 330/261 |
| 3,796,967 A | * 3/1974 | Sondermeyer | 330/298 |
| 3,999,143 A | * 12/1976 | Yoshida et al. | 330/207 A |
| 4,010,402 A | * 3/1977 | Miyata | 361/56 |
| 4,554,512 A | * 11/1985 | Aiello | 330/10 |

FOREIGN PATENT DOCUMENTS

| | | |
|---|---|---|
| JP | 62-269366 | 11/1987 |
| JP | 2-210835 | 8/1990 |
| JP | 5-129856 | 5/1993 |
| JP | 10-256268 | 9/1998 |

OTHER PUBLICATIONS

Monolithic Micro Ha Shuuseki Kairo, the Institute of Electronics, Information and Communication Engineers, Jan. 25, 1997 pp. 23, 91.

* cited by examiner

*Primary Examiner*—Patricia Nguyen
(74) *Attorney, Agent, or Firm*—Mattingly, Stanger & Malur, P.C.

(57) ABSTRACT

In a high frequency power amplifier module of a multi-stage structure in which a plurality of heterojunction bipolar transistors (npn-type HBTs) are cascade-connected, a protection circuit in which a plurality of pn junction diodes are connected in series is connected between the collector and emitter of each HBT. The p-side is connected to the collector side, and the n-side is connected to the emitter side. A protection circuit in which pn junction diodes of the number equal to or smaller than that of the pn junction diodes are connected in series is connected between the base and the emitter. The p-side is connected to the base side, and the n-side is connected to the emitter side. With the configuration, in the case where an overvoltage is applied across the collector and emitter due to a fluctuation in load on the antenna side, the collector terminal is clamped by an ON-state voltage of the protection circuits, so that the HBT can be prevented from being destroyed. Since the similar protection circuit is assembled between the base and emitter, even when the operator touches the module at the time of manufacturing the high frequency power amplifier module, the HBT can be prevented from being destroyed by the clamping effect of the protection circuit between the base and emitter and the protection circuit between the collector and emitter. Thus, an improved manufacturing yield of the high frequency power amplifier module and a wireless communication apparatus can be achieved, and destruction caused by fluctuation in load impedance of the wireless communication apparatus can be prevented.

39 Claims, 14 Drawing Sheets

HIGH-FREQUENCY POWER AMPLIFICATION MODULE AND RADIO COMMUNICATION DEVICE

TECHNICAL FIELD

The present invention relates to a high frequency power amplifier module for obtaining a predetermined amplification factor by cascade connecting a plurality of heterojunction bipolar transistors, and a wireless communication apparatus in which the high frequency power amplifier module is assembled. More particularly, the invention relates to a technique effective for improving destruction resistance of a heterojunction bipolar transistor to fluctuations in load impedance.

BACKGROUND ART

At an input stage of a transmitter of a wireless communication apparatus (mobile communication apparatus) such as an automobile telephone or portable telephone, an amplifier (high frequency power amplifier module, or RF power module) in which MOSFETs (Metal Oxide Semiconductor Field-Effect-Transistors), GaAs-MES (Metal-Semiconductor) FETs, HEMTs (High Electron Mobility Transistors), or HBTs (Heterojunction Bipolar Transistors) are formed at multiple stages is assembled.

The heterojunction bipolar transistor (HBT) is described in, for example, "A robust 3W high efficiency 8–14 Ghz GaAs/AlGaAs heterojunction bipolar transistor power amplifier", IEEE-MTTS, p581–584. This literature discloses a multi-finger HBT structure using cascade connection to improve destruction resistance of the HBT. Specifically, by using cascaded HBTs for each finger, a hot spot caused by concentration of currents can be suppressed, a breakdown voltage is increased, and destruction resistance is improved.

"Hitachi power MOSFET databook" issued by Semiconductor Division of Hitachi, Ltd., p47–48 describes that a diode (parasitic diode) is equivalently provided between the source and the drain of a power MOSFET and the parasitic diode has characteristics which are not inferior to those of a normal diode. It also describes that the parasitic diode can be used for a bridge circuit, an output stage of a PWM amplifier, and the like, so that an external commutation diode can be omitted. Therefore, the number of parts can be reduced.

Since the HBT has excellent characteristics such as high processing speed and low power consumption, it is being used as a semiconductor amplifying device of an RF power amplifier module or the like. FIG. 20 is a diagram showing the basic structure of a power amplifying circuit of the HBT.

As shown in FIG. 20, a heterojunction bipolar transistor (HBT) 1 employs a multi-finger structure in which a plurality of small HBT fingers 5 each having an emitter finger 2, a base finger 3, and a collector finger 4 are arranged in parallel. The fingers 2, 3, and 4 are connected in parallel with each other and connected to an emitter terminal 6, a base terminal 7, and a collector terminal 8, respectively.

In an operating mode, a power supplied from the base terminal 7 is distributed to the HBT fingers 5 and amplified. An amplified power is output to the collector fingers 4 and is further added, and a super power is output to the collector terminal 8.

In the power amplification circuit, to effectively supply the power to the load side, a load impedance 10 as a signal source is conjugate matched with an optimum impedance of the HBT via a matching circuit 11, thereby realizing characteristics of high gain and high efficiency.

Conventionally, destruction resistance of an output power amplifying device (semiconductor amplifying device) in a normal operation mode of the RF power amplifier is assured. Consequently, the output power amplifying device is not destroyed in the normal operation mode. Except for a specific example that the parasitic diode between the source and drain of an Si-MOSFET has the possibility that it operates as an equivalent protective device, a protective device is not intentionally provided for the output power amplifying device.

In the normal operation mode of a power amplifier in a mobile communication terminal such as a portable telephone, the output power amplifying device is not destroyed. It was, however, found that in the case such that the user touches the antenna of a mobile communication terminal, or a source voltage is applied in a state where an output terminal of a power amplifier is not properly terminated due to an erroneous work of an operator at the time of assembling a mobile communication terminal, the output power amplifying device of the power amplifier in the mobile communication terminal is destroyed.

FIG. 21 is a diagram schematically showing the relation between a static characteristic 15 of the power HBT and a matched load line 16. Under the matched condition, a current and a voltage on the load line are output to the load side. Under the matched condition, only a voltage lower than the breakdown voltage ($BV_{ceo}$) is applied to the collector terminal 8 of the HBT, so that a problem does not occur.

It was, however, found that in a practical state, when the HBT power amplifier is used for a transmitting unit of a portable telephone, the case that the matching condition particularly on the load side fluctuates from the optimal state often occurs. Specifically, as shown in FIG. 21, a load line 17, 18, or 19 that the load impedance is in an unmatched state is obtained, a voltage having an amplitude higher than that of a source voltage is applied to the collector terminal 8 in the HBT. When the voltage exceeds a device breakdown voltage, a device breakdown occurs, and it becomes a problem in practical use.

Also in an assembling work of manufacturing an RF power amplifier module by mounting an HBT on a module substrate, there is a case such that a device breakdown similarly occurs when the operator inadvertently touches a terminal or a line in the HBT. It can deteriorate the manufacturing yield of the RF power amplifier module and a wireless communication apparatus.

In order to prevent the device breakdown due to fluctuations in load, a method of setting the breakdown voltage of the HBT to a higher value can be generally considered but has a problem such that the method is not a sufficient countermeasure due to limitations of characteristics and structure.

On the other hand, in the conventional structure proposed to improve the destruction resistance of the HBT, it is difficult to perform a low voltage operation (of 2.7 to 4.2V) as the characteristic of GaAs. Since two HBTs are formed for each finger, there is a problem such that the device size (chip size) enlarges.

An object of the invention is to provide a high frequency power amplifier module and a wireless communication apparatus having a high destruction resistance to a load fluctuation.

Another object of the invention is to provide a technique capable of preventing destruction of a transistor such as a heterojunction bipolar transistor caused by fluctuations in potential due to a contact of the operator or the like at the time of manufacture of the high frequency power amplifier module and a wireless communication apparatus.

Further another object of the invention is to provide a high frequency power amplifier module and a wireless communication apparatus which operate excellently even in a state where a source voltage is lower than 5V.

Further another object of the invention is to provide a technique of realizing a smaller high frequency power amplifier module and a smaller wireless communication apparatus.

The above and other objects and novel features of the invention will become apparent from the description of the specification and the appended drawings.

Disclosure of Invention

Representative ones of inventions disclosed in the application will be briefly described as follows.

(1) A high frequency power amplifier module has:
an input terminal;
an output terminal;
a first voltage terminal;
a second voltage terminal;
a bias supply terminal;
a first semiconductor amplifying device having a control terminal connected to the input terminal and the bias supply terminal, a first terminal connected to the first voltage terminal, and a second terminal connected to the second voltage terminal, for supplying a signal according to a signal supplied to the input terminal from the first terminal to the output terminal; and
a first protection circuit which is a device different from a parasitic device existing in the first semiconductor amplifying device, connected to the first terminal and displays a rectifying characteristic in the forward direction in accordance with a voltage at the first terminal.

Each of the protection circuits is constructed by arranging a plurality of diodes in series.

A bias voltage of the first protection circuit is lower than a breakdown voltage between the first and second terminals with the control terminal open and is higher than a first source voltage applied to the first voltage terminal.

The protection circuit is constructed by a part of a plurality of semiconductor layers provided on a semiconductor substrate to form the semiconductor amplifying device.

The semiconductor amplifying device is formed by using any of a heterojunction bipolar transistor made of a compound semiconductor, a high electron mobility transistor made of a compound semiconductor, a field effect transistor made of a silicon semiconductor, an MESFET made of a compound semiconductor, and the like.

The heterojunction bipolar transistor has a multi-finger structure.

The heterojunction bipolar transistor is of an npn type, and the number (n) of diodes in each of the first and third protection circuits satisfies the following numerical expression:

$$\frac{V_{cc}}{V_f} \leq n \leq \frac{BV_{ceo}}{V_f}$$

where $V_{cc}$ denotes a first source voltage, $V_f$ indicates a forward ON-state voltage of a single pn junction diode, and $BV_{ceo}$ expresses a collector-emitter breakdown voltage with a base open.

Such a high frequency power amplifier module is assembled in a radio communication apparatus. That is, the high frequency power amplifier module is connected to the antenna of a wireless communication apparatus.

(2) The configuration of the means (1) is further provided with a second protection circuit which is a device different from a parasitic device existing in the first semiconductor amplifying device, connected to the first terminal, and displays a rectifying characteristic in the reverse direction when the first protection circuit displays the rectifying characteristic in the forward direction.

(3) The configuration of the means (1) or (2) is further provided with a third protection circuit which is a device different from a parasitic device existing in the semiconductor amplifying device, connected to the control terminal, and displays the rectifying characteristic in the forward direction in accordance with a voltage in the control terminal.

A bias voltage of the third protection circuit is lower than a breakdown voltage between first and second terminals with the control terminal open and is higher than a first source voltage applied to the first voltage terminal.

The semiconductor amplifying device is formed by using any of a heterojunction bipolar transistor made of a compound semiconductor, a high electron mobility transistor made of a compound semiconductor, a field effect transistor made of a silicon semiconductor, an MESFET made of a compound semiconductor, and the like.

The heterojunction bipolar transistor has a multi-finger structure.

The heterojunction bipolar transistor is of an npn type, and the number (n) of diodes in the third protection circuit satisfies the following numerical expression:

$$\frac{V_{cc}}{V_f} \leq n \leq \frac{BV_{ceo}}{V_f}$$

where $V_{cc}$ denotes a first source voltage, $V_f$ indicates a forward ON-state voltage of a single pn junction diode, and $BV_{ceo}$ expresses a collector-emitter breakdown voltage with a base open.

(4) The configuration of the means (3) is further provided with a fourth protection circuit which is a device different from a parasitic device existing in the semiconductor amplifying device, connected to the control terminal, and displays a rectifying characteristic in the reverse direction when the third protection circuit displays the rectifying characteristic.

(5) In the configuration of any one of the means (1) to (4), one or more second semiconductor amplifying devices are cascaded between the input terminal and the first semiconductor amplifying device, the second semiconductor amplifying device has a control terminal connected to the input terminal and the bias supply terminal, outputs a signal according to a signal from the input terminal, and has a first terminal connected to the first voltage terminal, and a second terminal connected to the second voltage terminal, and a protection circuit is provided for the first terminal and/or the control terminal of the second semiconductor amplifying device.

(6) A high frequency power amplifier module has:
an input terminal;
an output terminal;
a first transistor having a control terminal for receiving a signal from the input terminal and a first terminal for supplying a signal according to the signal supplied to the control terminal to the output terminal; and a first protection circuit connected to the first terminal of the first transistor. The first protection circuit has a plurality of pn junction semiconductor devices connected in series.

The high frequency power amplifier module further includes a second protection circuit connected to the first terminal, the second protection circuit has a plurality of pn junction semiconductor devices connected in series, and a rectifying characteristic of the plurality of pn junction semiconductor devices connected in series is opposite to that of the plurality of pn junction semiconductor devices connected in series in the first protection circuit.

The high frequency power amplifier module further includes:

a first voltage terminal;

a second voltage terminal; and a bias circuit connected between the first voltage terminal and the first terminal, and the first protection circuit is connected between the first terminal and the second voltage terminal.

The second protection circuit is connected between the first terminal and the second voltage terminal.

The first and second protection circuits clamp a voltage at the first terminal by the plurality of pn junction semiconductor devices connected in series.

According to the means (1), (a) since the protection circuit in which a plurality of pn junction diodes are connected in series is connected between the collector and the emitter of each semiconductor amplifying device (for example, HBT). The p-side is connected to the collector side, and the n-side is connected to the emitter side. Consequently, when an overvoltage is applied across the collector and emitter by a fluctuation in load (load impedance) on the antenna side, the collector terminal is clamped by the ON-state voltage of the protection circuit. Thus, the HBT (semiconductor amplifying device) can be prevented from being destroyed.

(b) In the wireless communication apparatus in which such a high frequency power amplifier module is assembled, even the user touches the antenna and a fluctuation occurs in the load impedance, by the clamping effect of the protection circuit between the collector and emitter, the HBT (semiconductor amplifying device) can be prevented from being destroyed. Therefore, the user can continue conversation in an excellent state, and the reliability of communication is stabilized.

According to the means (2), in addition to the effect of the means (1), since the second protection circuit displaying the rectifying characteristic in the reverse direction when the first protection circuit displays the rectifying characteristic in the forward direction is provided, even if a load fluctuation in the reserve direction occurs, the HBT can be prevented from being destroyed by the clamping effect of the second protection circuit.

According to the means (3), in addition to the effects of the means (1) and (2), since the control terminal is provided with the third protection circuit having the rectifying characteristic in the forward direction in accordance with the voltage at the control terminal, the HBT is not destroyed by an overvoltage incidentally applied at the time of manufacturing the high frequency power amplifier module or the wireless communication apparatus.

According to the means (4), in addition to the effects of the means (3), the control terminal is provided with the fourth protection circuit displaying the rectifying characteristic in the reverse direction when the third protection circuit displays the rectifying characteristic, so that the HBT is not destroyed by an overvoltage incidentally applied at the time of manufacturing the high frequency power amplifier module or the wireless communication apparatus.

According to the means (5), also in the configuration that one or more second semiconductor amplifying devices are cascaded between the input terminal and the first semiconductor amplifying device, the first terminal and/or control terminal in the second semiconductor amplifying device is/are provided with the protection circuit. Consequently, destruction of the HBT due to a load fluctuation in the high frequency power amplifier module and the wireless communication apparatus can be prevented by the clamping effect of the protection circuit, and destruction of the HBT caused by an overvoltage incidentally generated in the manufacture of the high frequency power amplifier module and the wireless communication apparatus can be also prevented. As a result, the manufacturing yield of the high frequency power amplifier module and the wireless communication apparatus can be improved, and stable communication of the wireless communication apparatus can be achieved.

Also in the high frequency power amplifier module according to the means (6), by the clamping effect of the first and second protection circuits connected to the first terminal of the first transistor, destruction of the HBT caused by a load fluctuation and destruction of the HBT due to an overvoltage incidentally applied at the time of manufacturing the high frequency power module can be prevented.

BEST MODE FOR CARRYING OUT THE INVENTION

Figure 1:
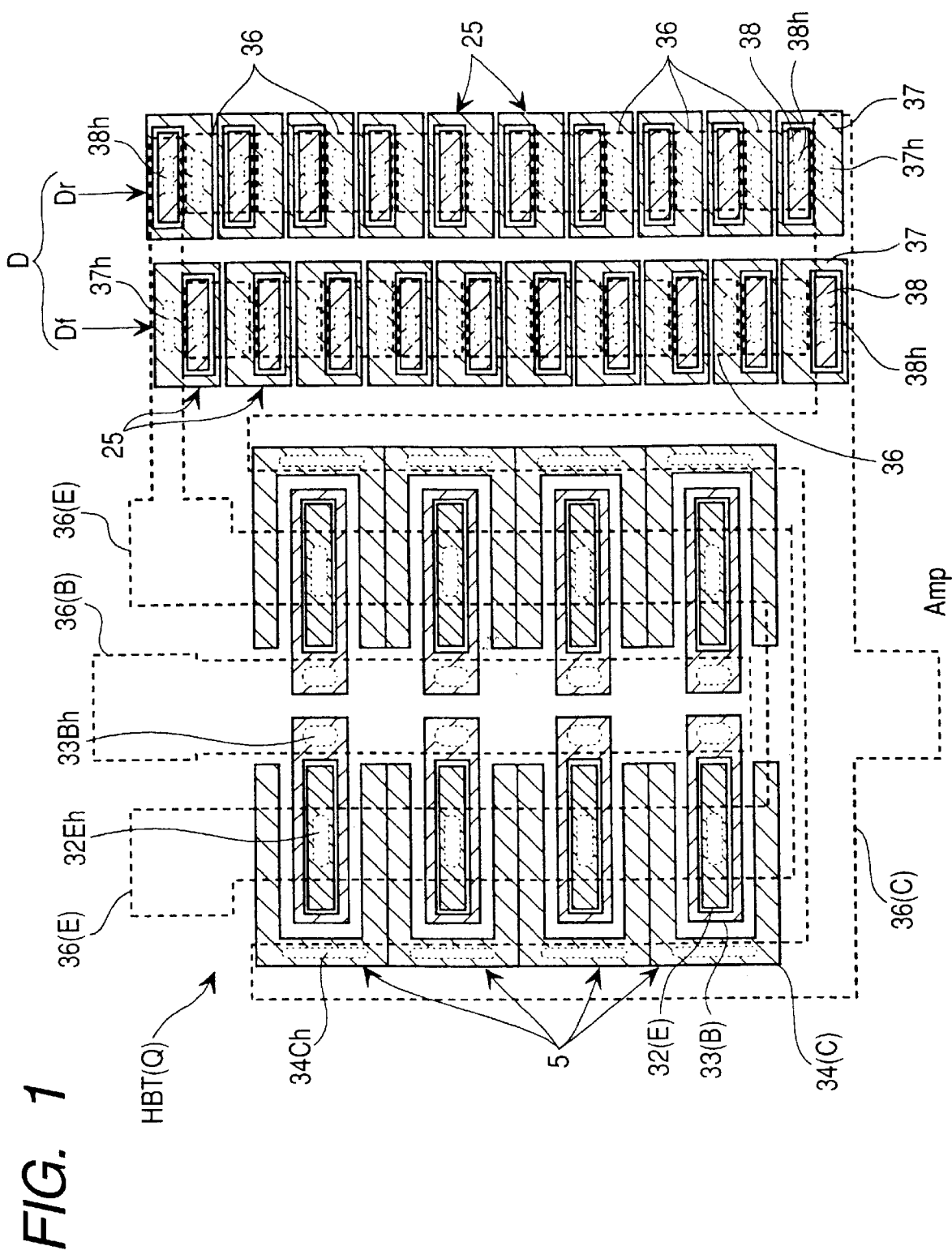
FIG. 1 is a schematic plan view showing a multi-finger pattern of an HBT with a protection circuit in an RF power amplifier module as an embodiment (first embodiment) of the invention.

Embodiments of the invention will be described in detail hereinbelow with reference to the drawings. In all the drawings for explaining the embodiments of the invention, components having the same function are designated by the same reference numeral and the description will not be repeated.

FIRST EMBODIMENT

FIGS. 1 to 16 are diagrams related to an RF power amplifier module according to an embodiment (first embodiment) of the invention. FIGS. 1 to 5 are diagrams related to a protection circuit and an HBT with the protection circuit. FIGS. 6 to 11 are diagrams related to a method of manufacturing the HBT with the protection circuit. FIGS. 12 to 15 are diagrams related to the RF power amplifier module. FIG. 16 is a block diagram showing the configuration of a wireless communication apparatus in which the RF power amplifier module according to the first embodiment is assembled. An RF power amplifier module (transmission power amplifier) 40 according to the first embodiment has an appearance of, as shown by the perspective view of FIG. 12, a flat rectangular structure. The RF power amplifier module 40 has a structure such that a flat, rectangular package 43 is constructed by a plate-shaped wiring board 41 and a cap 42 attached to a face (principal face) of the wiring board 41. The cap 42 is made of a metal playing the role of an electromagnetic shield.

Electrically independent external electrode terminals (electrode terminals) are led from the package 43. In the example, the external electrode terminals for surface mounting extend from side faces of the wiring board 41 to the under face. The external electrode terminals are formed by wiring layers formed on the surface of the wiring board 41 and a PbSn solder or the like applied on the surface of the wiring layers.

Figure 12:
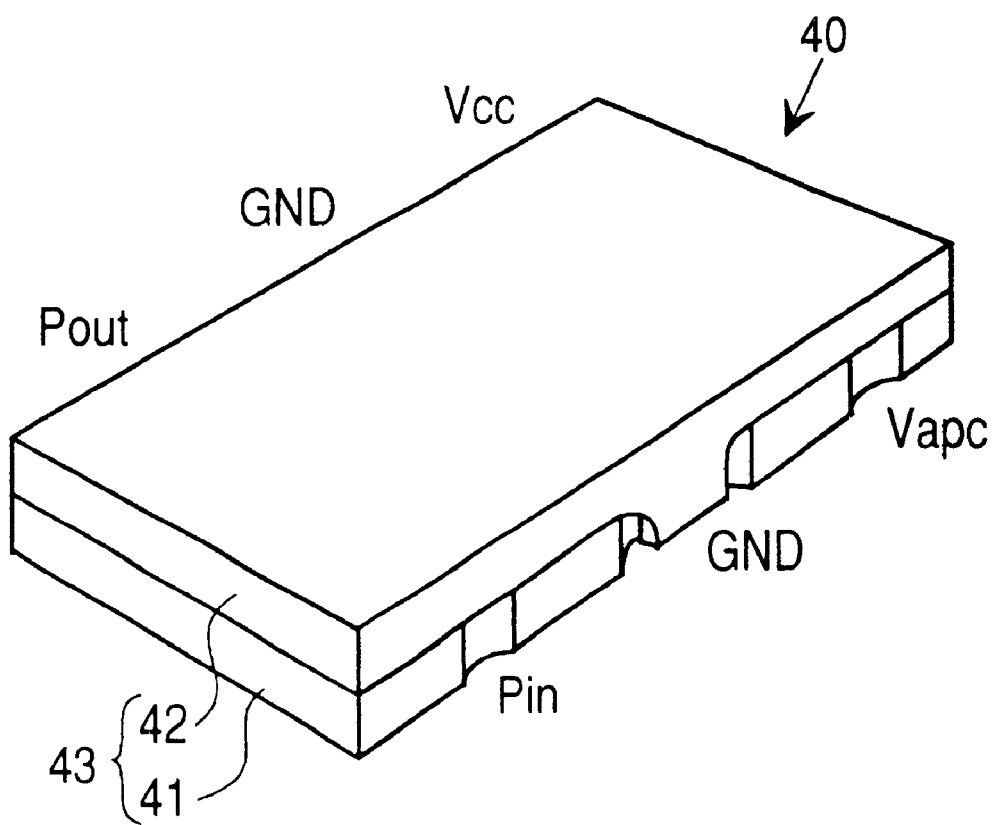
FIG. 12 is a perspective view showing the appearance of the RF power amplifier module of the first embodiment.

The external electrode terminals include, as shown in FIG. 12 in accordance with the order from left to right on a side of the package 43, an input terminal (Pin), a second voltage terminal (GND), and a bias supply terminal (Vapc), and in accordance with the order from left to right on the other side of the package 43, an output terminal (Pout), GND, and a first voltage terminal (Vcc)

Figure 13:
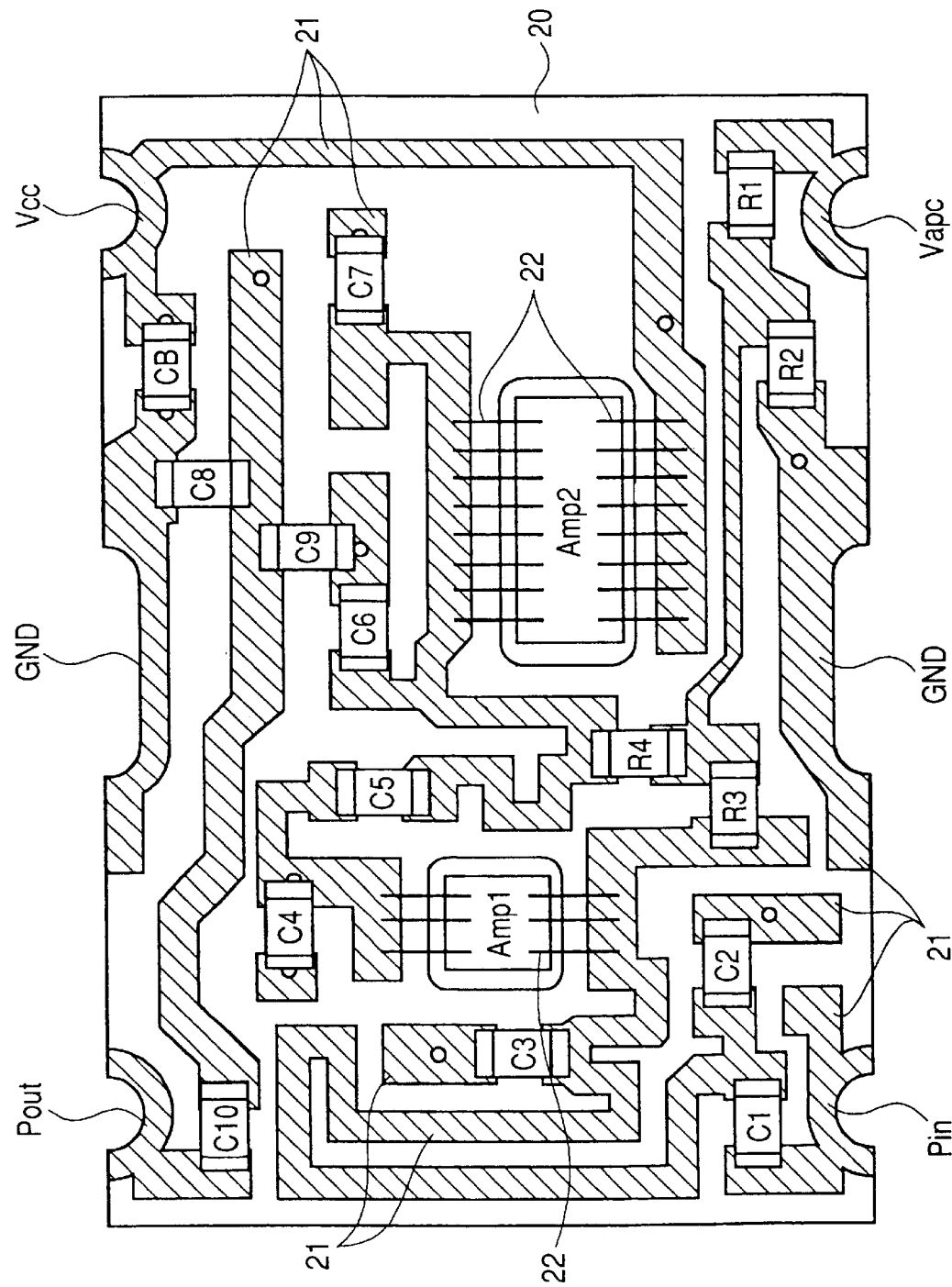
FIG. 13 is a plan view showing a state where electronic parts in the RF power amplifier module are mounted.
Figure 15:
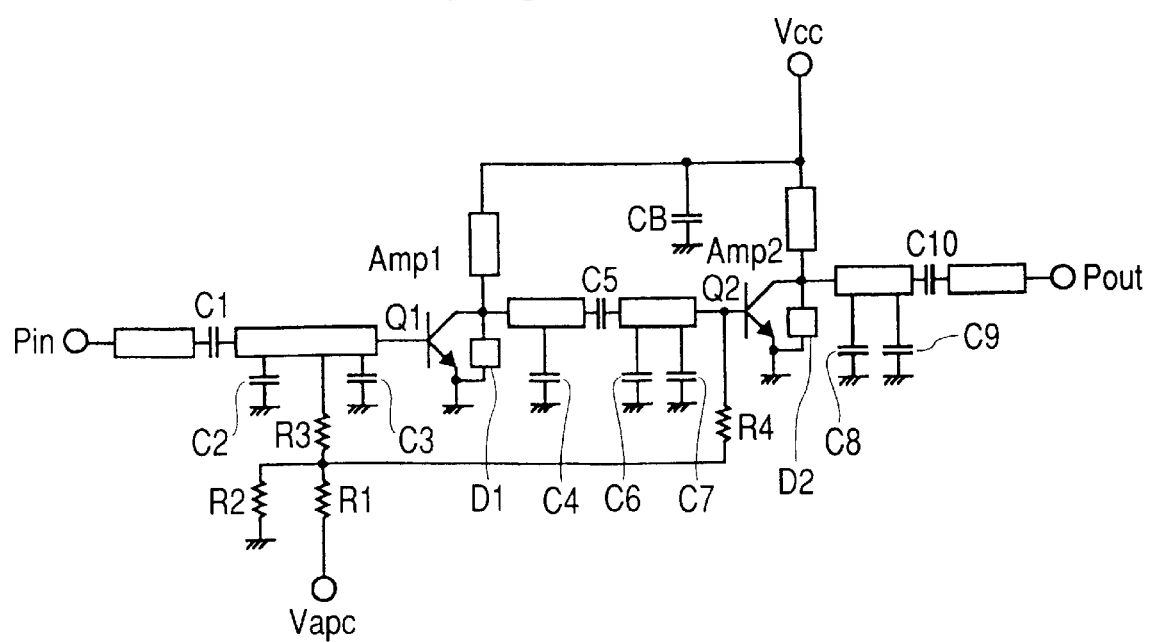
FIG. 15 is a diagram of an equivalent circuit of the RF power amplifier module.
Figure 16:
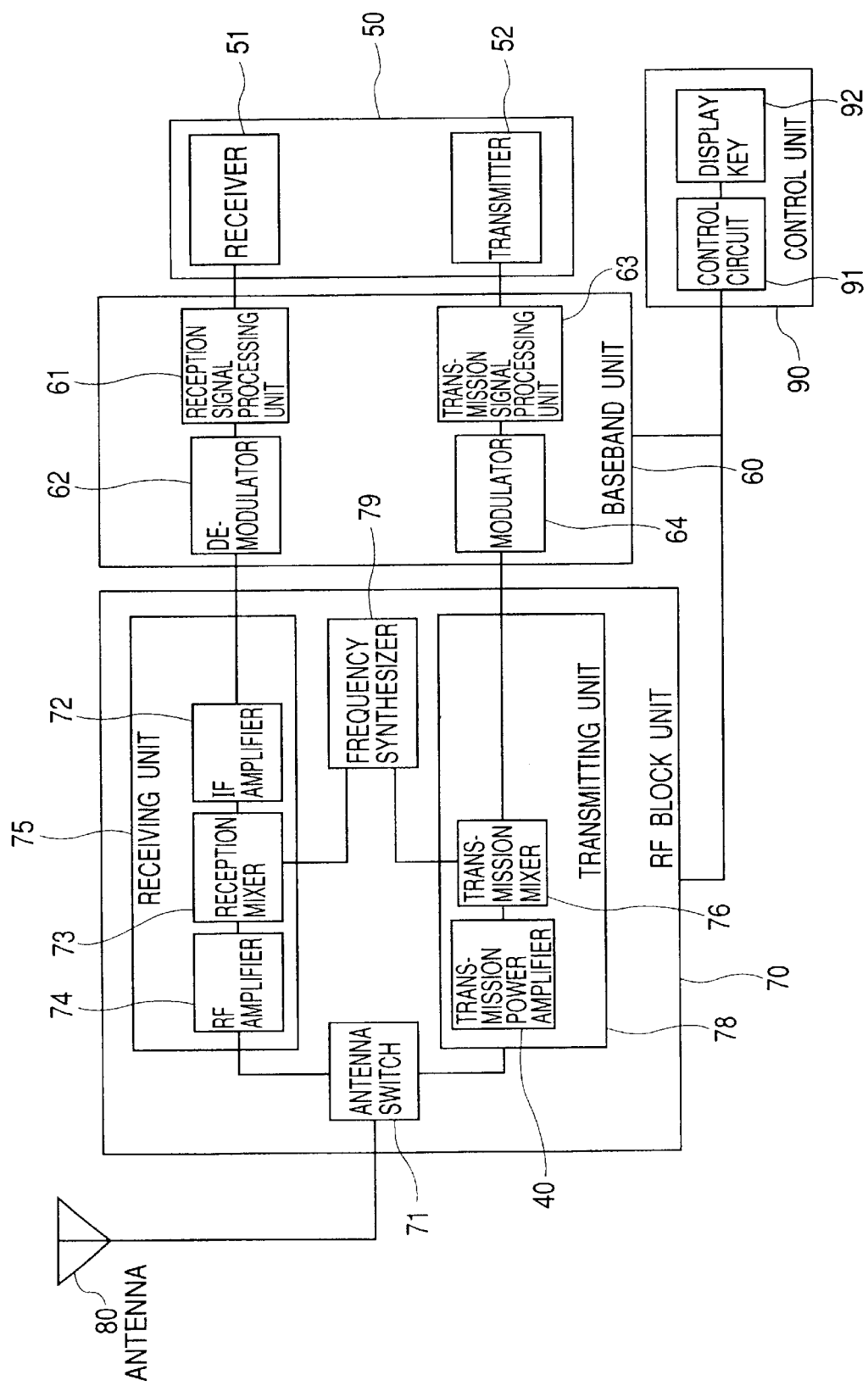
FIG. 16 is a block diagram showing the configuration of a wireless communication apparatus in which the RF power amplifier module of the first embodiment is assembled.

As shown in the plan view of a module board 20 of FIG. 13 and the diagram of an equivalent circuit of FIG. 15, the RF power amplifier module 40 has a structure of a two-stage amplifier in which semiconductor amplifying devices (for example, heterojunction bipolar transistors) each with a protection circuit are cascade connected.

As the semiconductor amplifying devices each with a protection circuit, a semiconductor amplifying device (Amp1) with a protection circuit (D1) provided between a first terminal (collector terminal) of an HBT (Q1) and a second terminal (emitter terminal), and a semiconductor amplifying device (Amp2) with a protection circuit (D2) provided between a first terminal (collector terminal) of an HBT (Q2) and a second terminal (emitter terminal) are used.

In the first embodiment, the example of the two-stage RF power amplifier module having the first semiconductor amplifying device and the final semiconductor amplifying device will be described. The invention can be also applied to a configuration that one or more intermediate semiconductor amplifying devices are cascaded between the first semiconductor amplifying device and the final semiconductor amplifying device. In the first embodiment, as the semiconductor amplifying devices, semiconductor amplifying devices each with the protection circuit are used.

In the equivalent circuit of FIG. 15, for the purpose of matching, potential adjustment, or the like, capacitors (C1 to C10), a bypass capacitor (CB), and resistors (R1 to R4) are assembled. Amp1 and Amp2 denote semiconductor amplifying devices (HBT) each with a protection circuit. Blank blocks indicate microstrip lines.

The module board 20 is, for example, a wiring board obtained by stacking layers of glass ceramics (for instance, four layers) and being burned at low temperature. Wiring is conducted by using a high conductive metal such as a silver metal. Specifically, an external wiring layer is made of Ag—Pt, and an internal wiring layer is made of Ag. Low-temperature burning is carried out at about 600° C., so that Ag having a low melting point can be used. Since Ag is a high conductive metal having a low resistance value, an improved high frequency characteristic can be achieved.

Figure 14:
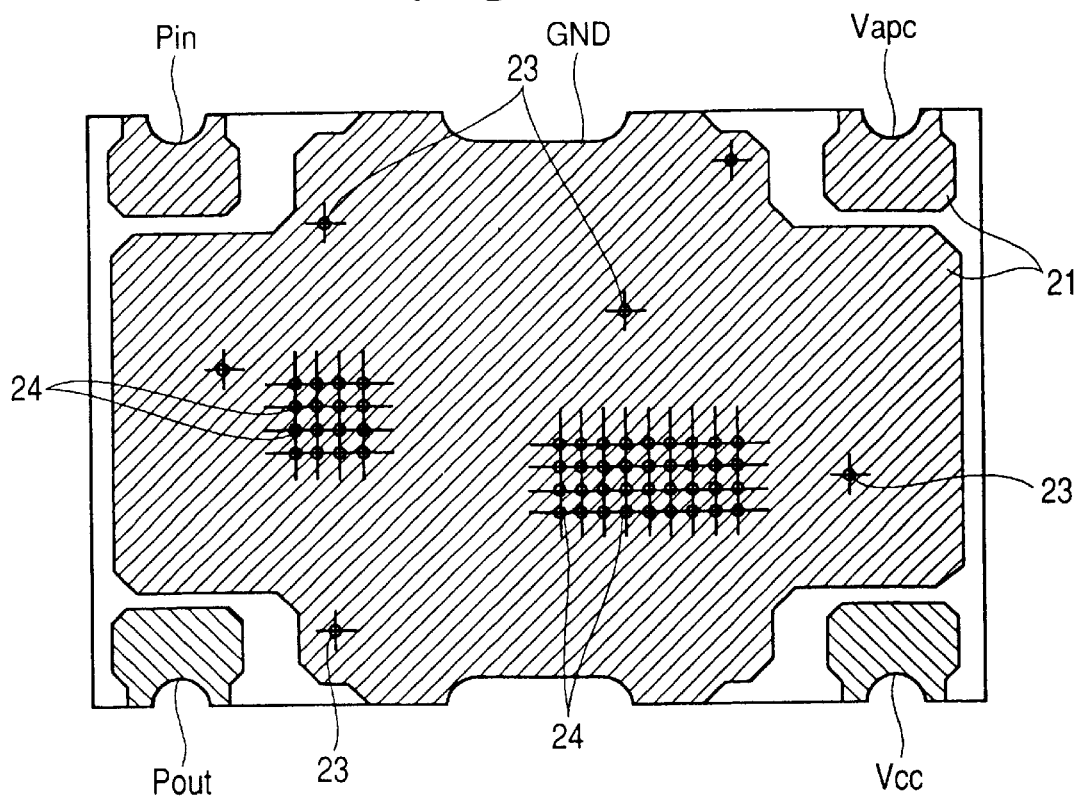
FIG. 14 is a bottom view of the RF power amplifier module.

FIG. 13 is a plan view of the module board 20. FIG. 14 is a bottom view of the module board 20, that is, the bottom view of the RF power amplifier module 40. As shown in FIG. 13, on the surface of the module board 20, as electronic parts, chip capacitors (C1 to C10 and CB), chip resistors (R1 to R4), and semiconductor amplifying devices (Amp1 and Amp2) each with a protection circuit are mounted. Reference numeral 21 denotes a wiring layer. Electrode portions of the chip capacitors and chip resistors are electrically connected to the wiring layer 21 by a conductive jointing material such as solder (not shown). The electrodes of the HBT (semiconductor amplifying device with the protection circuit) are electrically connected to the wiring layer 21 via conductive wires 22.

The wiring layer 21 on the module board 20 is electrically connected to an internal wiring layer via a conductor 23 (indicated by blank circles in the wiring layer 21 in FIG. 13) charged in through holes and the wiring layer 21 on the under face of the module board 20 as the external electrode terminals shown in FIG. 14.

In order to dissipate heat generated by the HBT, thermal vias 24 (refer to FIG. 14) are provided in the module board 20 in pad areas to which the semiconductor amplifying devices (Amp1 and Amp2) with protection circuits are fixed. The thermal vias 24 are formed by filling the through holes with a conductor. The heat generated by the HBTs (semiconductor amplifier devices with protection circuits) is transmitted to the outside of the package 43 via the thermal vias 24 and to a wiring board such as a mother board, thereby enabling a stable amplifying operation to be performed.

The RF power amplifier module 40 of the first embodiment has, for example, a transmission frequency of 0.8 GHz, a source voltage of 2.7 to 4.2V, an output up to 35 dBm, and efficiency up to 60%.

FIG. 16 is a block diagram showing the system configuration of a wireless communication apparatus in which the RF power amplifier module according to the first embodiment is assembled. Concretely, FIG. 16 shows the system configuration of a portable telephone (mobile communication terminal).

The portable telephone has: a transceiver 50 constructed by a receiver 51 and a transmitter 52; a baseband unit 60 including a reception signal processing unit 61 connected to the receiver 51, a demodulator 62, a transmission signal processing unit 63 connected to the transmitter 52, and a modulator 64; an RF block 70 connected to the baseband unit 60, an antenna 80 connected to the RF block 70, and a control unit 90 having a control circuit 91 connected to the baseband unit 60 and the RF block 70 and a display key 92.

The RF block 70 is provided with an antenna switch 71. The antenna switch 71 is connected to: an RF amplifier 74 in a receiving unit 75 constructed by an IF amplifier 72, a reception mixer 73, and the RF amplifier 74; the RF power amplifier module 40 in a transmitting unit 78 constructed by the transmission power amplifier (RF power amplifier module) 40; and the antenna 80.

The reception mixer 73 and the transmission mixer 76 are connected to a frequency synthesizer 79.

In a transmission system, voice (acoustic signal) sent to the transmitter 52 is converted by the transmitter 52 into an electric signal, converted by the transmission signal processing unit 63 into a transmission signal, and analog-to-digital converted by the modulator 64. After that, the transmission signal is converted by the frequency synthesizer 79 to a target frequency in the transmission mixer 76 in the transmission unit 78. The resultant is amplified by the RF power amplifier module 40 of the first embodiment, and the amplified signal is transmitted by the switching of the antenna switch 71 as a radio wave from the antenna 80.

In a reception system, the reception signal captured by the antenna 80 is amplified by the RF amplifier 74 in the receiving unit 75 by the switching of the antenna switch 71, and the amplified signal is converted to a target frequency by the frequency synthesizer 79 in the receiving mixer 73. After that, the reception signal is amplified by the IF amplifier 72, and the amplified digital signal is converted to an analog signal by the demodulator 62 in the baseband unit 60. The analog signal is processed by the reception signal processing unit 61 and converted to an acoustic signal by the receiver 51.

Since higher efficiency of the RF power amplifier module 40 is achieved by using the HBT in the portable telephone of the first embodiment, the portable telephone can be used for long time by a single charging operation.

The semiconductor amplifying device (Amp) with the protection circuit (D) used in the RF power amplifying module 40 of the first embodiment will now be described. In the equivalent circuit of FIG. 15, the semiconductor amplifying devices with protection circuits are expressed by Amp1 and Amp2 and the protection circuits are indicated by D1 and D2. In this case, a semiconductor amplifying device with a protection circuit will be referred to as Amp, and the protection circuit will be expressed by D. Description will be given with reference to FIGS. 1 to 5.

Figure 2:
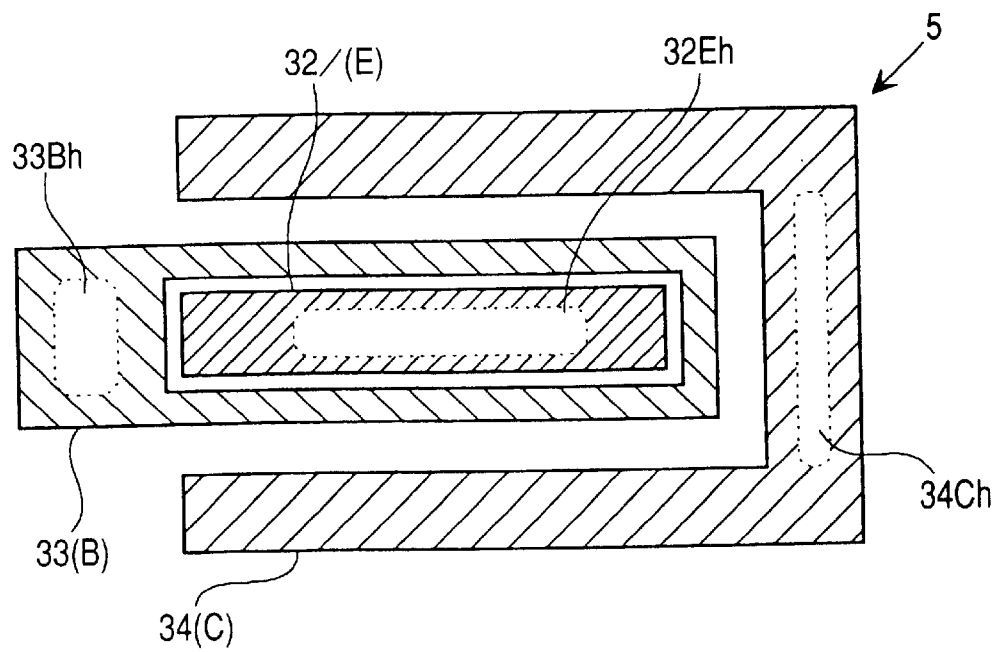
FIG. 2 is a layout sketch of one finger in the HBT.
Figure 3:
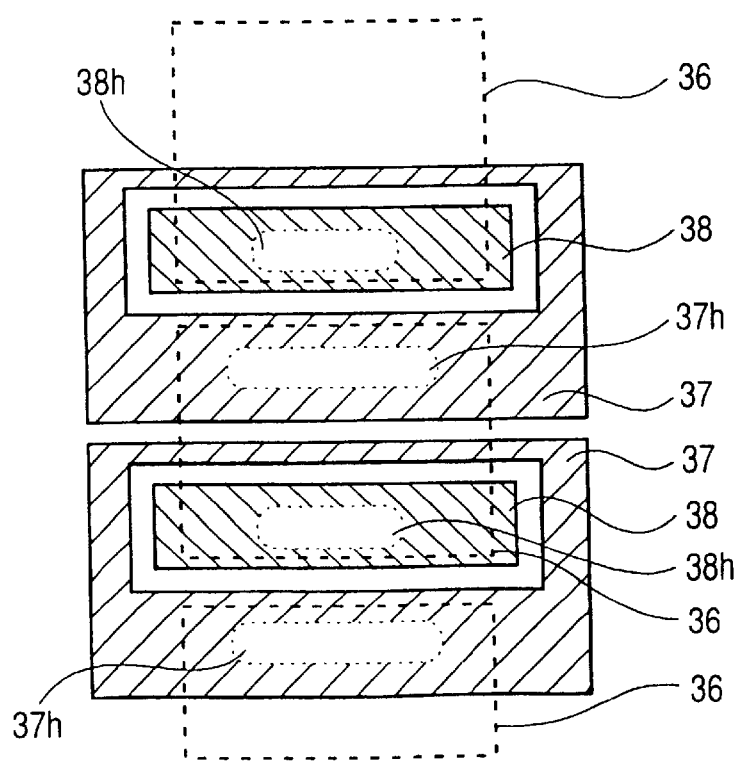
FIG. 3 is a layout sketch of a pn junction diode as a component of the protection circuit.
Figure 4:
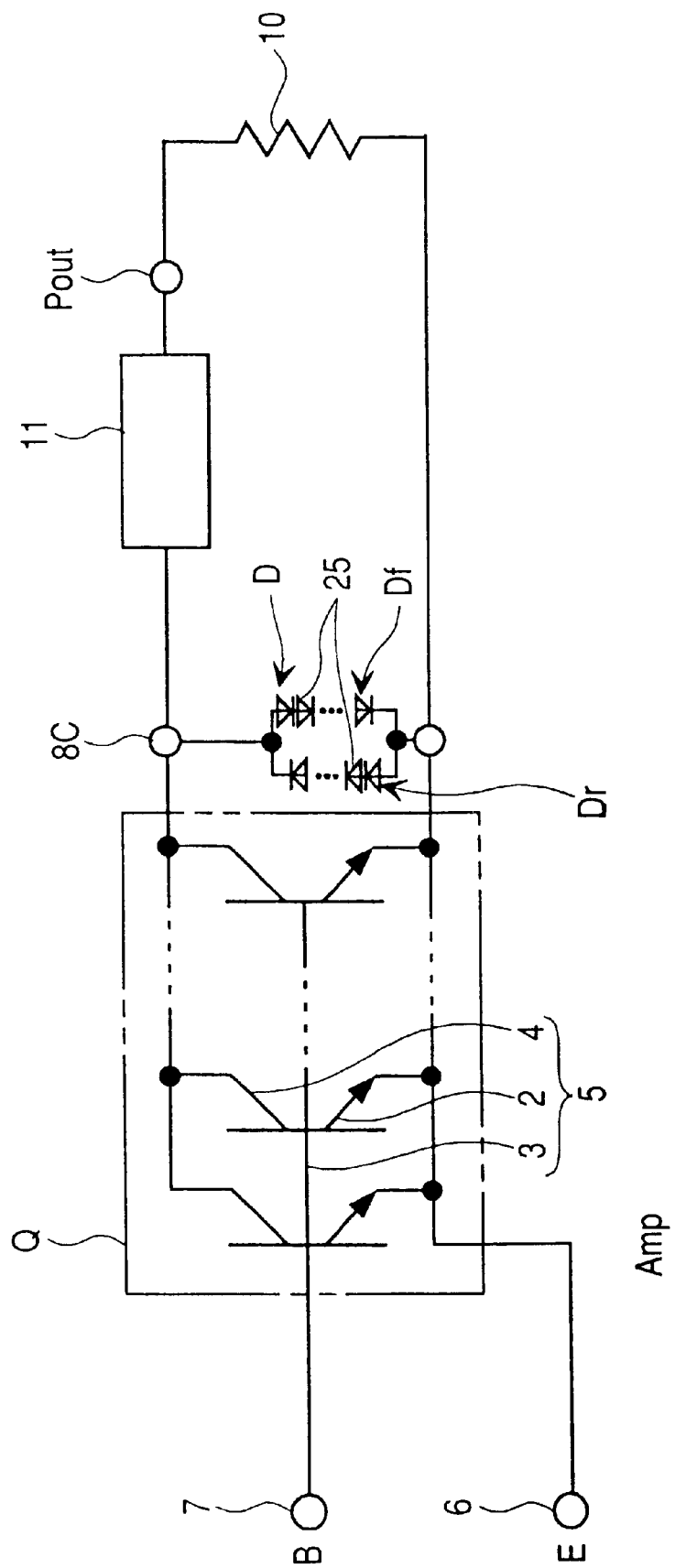
FIG. 4 is a diagram showing an equivalent circuit including the HBT and the protection circuit.
Figure 5:
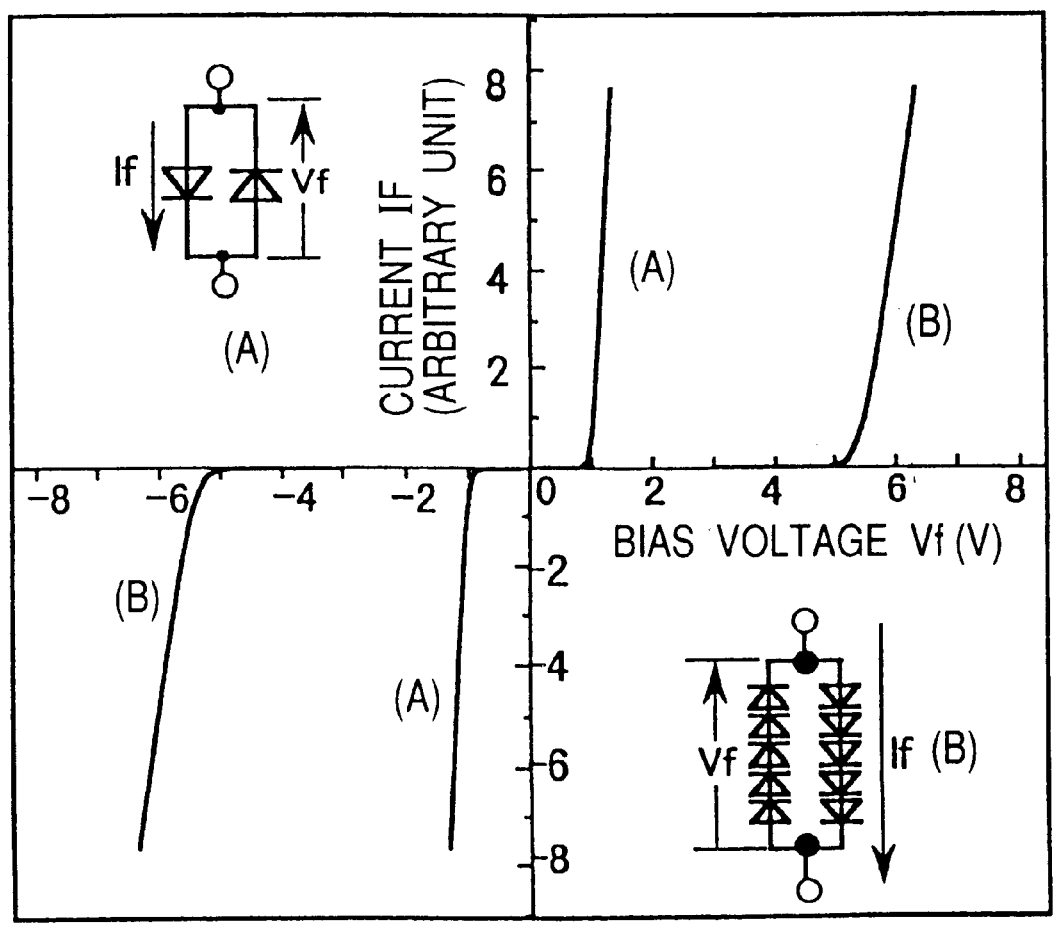
FIG. 5 is a graph showing characteristics of the protection circuit.

FIG. 1 is a schematic plan view of the semiconductor amplifier (Amp) in which the protection circuit (D) is assembled between the first terminal (collector terminal) and the second terminal (emitter terminal) of an HBT (Q) of an eight-finger structure. FIG. 2 is a diagram showing an example of layout of one finger. FIG. 3 is a layout sketch of a plurality of pn junction diodes constructing the protection circuit. FIG. 4 is a circuit diagram including the semiconductor amplifying device (Amp) with the protection circuit. FIG. 5 is a graph showing a current-voltage characteristic of the protection circuit.

In the first embodiment, as shown in FIG. 4, the HBT (Q) has an eight-finger configuration in which eight HBT fingers 5 each constructed by the emitter finger 2, base finger 3, and collector finger 4 are connected in parallel with each other (refer to FIGS. 1 and 2). The semiconductor amplifying device (Amp) with the protection circuit has three external electrode terminals of the second terminal (emitter [E] terminal) 6, control terminal (base [B] terminal) 7, and first terminal (collector [C] terminal) 8, the HBT (Q) having the above-described configuration, and the protection circuit D provided between the collector terminal 8 and the emitter terminal 6.

The protection circuit (D) may be formed in various configurations. In the first embodiment, the protection circuit (D) has a configuration in which protection circuits (Df) and (Dr) are provided in parallel with each other between the collector terminal 8 of the HBT (Q) and the emitter terminal 6. The protection circuit (Df) has a rectifying characteristic in the forward direction in accordance with a voltage in the collector terminal 8. The protection circuit (Dr) displays a rectifying characteristic in the reverse direction when the first protection circuit shows the rectifying characteristic in the forward direction. The protection circuit (Df) having the rectifying characteristic in the forward direction is also called the first protection circuit. The protection circuit (Dr) having the rectifying characteristic in the reverse direction is also called the second protection circuit.

When such a semiconductor amplifying device (Amp) with the protection circuit is assembled in the RF power amplifying module, as shown in FIG. 4, the matching circuit 11 is provided between the output terminal (Pout) of the RF power amplifier module and the collector terminal 8. When the RF power amplifier module is assembled in a portable telephone, as shown in FIG. 4, the signal source or the load impedance 10 is applied across the output terminal (Pout) and the second voltage terminal (GND), that is, the emitter terminal 6 via the antenna.

Each of the protection circuits (Df) and (Dr) constructing the protection circuit D has a structure that a plurality of pn junction diodes are connected in series (refer to FIGS. 1 and 3). The pn junction diode is formed by using the pn junction between a p-type base layer and an n-type sub-collector layer provided on the semi-insulating GaAs substrate to form the HBT. As the pn junction diode, not only a base-collector junction but also a base-emitter junction may be used. In the first embodiment, each of the protection circuit (Df) having the rectifying characteristic in the forward direction and the protection circuit (Dr) having the rectifying characteristic in the reverse direction has a configuration that ten pn junction diodes are connected in series (refer to FIG. 1).

As shown in FIG. 5, $V_f$ of the pn junction diode formed by using the p-type GaAs base layer and the n-type GaAs sub-collector layer formed on the semi-insulating GaAs substrate becomes about 1V. Consequently, by constructing each of the protection circuit (Df) having the rectifying characteristic in the forward direction and the protection circuit (Dr) having the rectifying characteristic in the reverse direction by connecting ten pn junction diodes in series as in the first embodiment, $V_f$ in the forward and reverse directions of the whole line of the diodes becomes about 10V. A collector-emitter breakdown voltage ($BV_{ceo}$) with the base open of the HBT (Q) becomes approximately 10V, so that the HBT (Q) is not destroyed by fluctuations in the load impedance.

Figure 6:
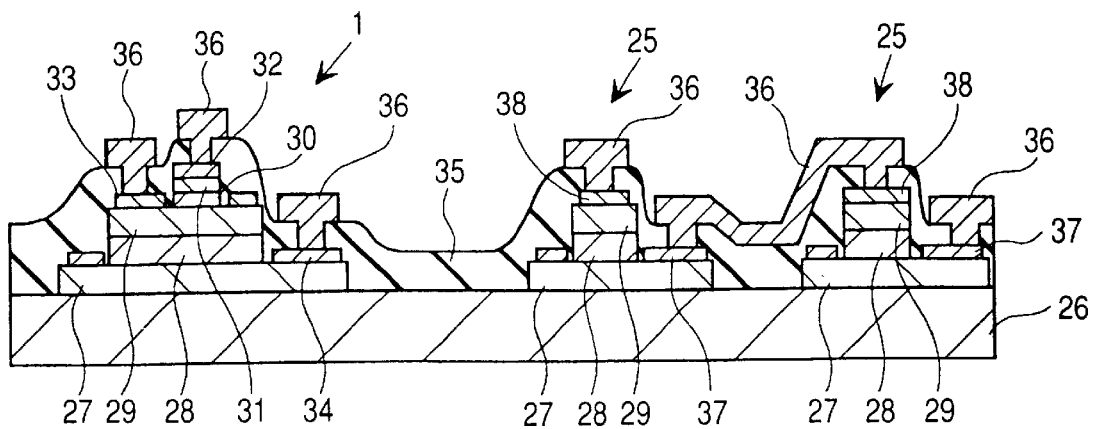
FIG. 6 is a cross section of the HBT with the protection circuit.

The structure of the semiconductor amplifying device assembled in the RF power amplifier module 40 of the first embodiment, that is, the semiconductor amplifying device (Amp) with the protection circuit, and a method of manufacturing the semiconductor amplifying device will now be described. FIG. 6 is a cross section of the semiconductor amplifying device (Amp) with the protection circuit of the first embodiment. FIGS. 7 to 11 are cross sections in manufacturing processes of the semiconductor amplifying device (Amp) with the protection circuit. In the diagrams, pn junction diodes are shown in a state where two pn junction diodes are connected in series.

The semiconductor amplifying device (Amp) with the protection circuit has, although not shown, a rectangular shape and has therein the HBT (Q) and the protection circuit (D). The semiconductor amplifying device (Amp) with the protection circuit has a configuration that, as shown in FIG. 1, the HBT (Q) is disposed on the left side of the chip and the protection circuit (D) is disposed on the right side. The HBT (Q) has eight fingers which are in a pattern that four HBT fingers 5 are disposed on each of the right and left sides, a wiring layer (base wiring layer) 36 extends in the vertical direction in the center of the drawing, the wiring layer (emitter wiring layer) 36 extends in a U shape on both sides of the vertical wiring layer 36 and downward, and the eight HBT fingers 5 are surrounded by the U-shaped wiring layer (contact wiring layer) 36. The wiring layer 36 for the emitter and the wiring layer 36 for the contact extend to the side of the right protection circuit (D) so as to be connected to the p-type electrode and the n-type electrode of the protection circuit (D).

In the heterojunction bipolar transistor (HBT) 1, as shown in FIG. 6, an n-type GaAs sub-collector layer 27 selectively formed by an n⁺ type GaAs layer is provided on a face (principal face) of a substrate (semi-insulating GaAs substrate) 26 having a thickness of about 80 μm. The thickness of the n-type GaAs sub-collector layer 27 is about 600 nm. In the center of the top face of the n-type GaAs sub-collector layer 27, an n-type GaAs collector layer 28 formed by an n-type GaAs layer is provided. The n-type GaAs collector layer 28 has a thickness of about 800 nm.

On the top face of the n-type GaAs collector layer 28, a p-type GaAs base layer 29 formed by a p⁺ type GaAs layer is provided so as to be overlapped. The n-type GaAs collector layer 28 and the p-type GaAs base layer 29 have the same pattern. The p-type GaAs base layer 29 has a thickness of about 50 nm.

On the center of the p-type GaAs base layer 29, an n-type InGaP/GaAs emitter layer 30 formed by sequentially depositing n-type InGaP and GaAs is provided. In the n-type InGaP/GaAs emitter layer 30, the thickness of the InGaP layer as the lower layer is 30 nm, and that of the GaAs layer as the upper layer is about 200 nm. On the top face of the n-type InGaP/GaAs emitter layer 30, an InGaAs cap layer 31 made of InGaAs is formed in the same pattern as that of the n-type InGaP/GaAs emitter layer 30 so as to be overlapped.

An emitter electrode 32 is formed on the whole InGaAs cap layer 31, a base electrode 33 is formed on the p-type GaAs base layer 29 exposed around the n-type InGaP/GaAs emitter layer 30, and a collector electrode 34 is formed on the n-type GaAs sub-collector layer 27 exposed around the n-type GaAs collector layer 28. For example, the emitter electrode 32 is formed by a WSi alloy layer, the base electrode 33 is formed by a Pt/Ti/Au alloy layer, and the collector electrode 34 is formed by an AuGe/Ni/Au alloy layer.

The principal face of the semi-insulating GaAs substrate 26 is covered with an insulating film 35, and the insulating film 35 in the predetermined portions on the emitter electrode 32, base electrode 33, and collector electrode 34 is selectively removed, thereby forming contact holes. The wiring layer 36 in predetermined patterns is formed in the contact holes and on the predetermined parts of the insulating film 35.

FIG. 2 is a schematic diagram showing the HBT finger 5. A portion linearly extending in the horizontal direction is the base electrode 33, and a portion linearly extending to the inside of the base electrode except for the left end portion is the emitter electrode 32. A U-shaped portion extending so as to surround the base electrode 33 is the collector electrode 34. Areas which are not hatched in the electrodes are the contact holes which enables contact with the wiring layer 36. Reference numeral 32E$h$ denotes a contact hole to the emitter wiring layer, 33B$h$ denotes a contact hole to the base wiring layer, and 34C$h$ indicates a contact hole to the collector wiring layer.

On the semi-insulating GaAs substrate 26, a pn junction diode 25 is formed by using the semiconductor layers for forming the HBT 1. Specifically, the pn junction diode 25 has the structure that an n-type electrode 37 is formed on a part of the n-type GaAs sub-collector layer 27 selectively provided on the semi-insulating GaAs substrate 26, the n-type GaAs collector layer 28 is selectively provided on the n-type GaAs sub-collector layer 27, the p-type GaAs base layer 29 is further provided on the n-type GaAs collector layer 28, and a p-type electrode 38 is provided on the p-type GaAs base layer 29.

The n-type electrode 37 and the p-type electrode 38 are connected to the electrodes of the neighboring pn junction diodes 25 and the first terminal (collector terminal) or the second terminal (emitter terminal) of the HBT 1 via the wiring layer 36 filled in the contact holes formed in the insulating film 35 covering the n-type GaAs sub-collector layer 27, n-type GaAs collector layer 28, p-type GaAs base layer 29, n-type electrode 37, and p-type electrode 38 and extending on the insulating film 35.

FIG. 3 is a schematic diagram showing the neighboring pn junction diodes 25 in the line of the pn junction diodes. In the diagram, a forward-hatched area indicates the n-type electrode 37, a backward-hatched area expresses the p-type electrode 38, and portions indicated by broken lines indicate the wiring layer 36. An area which is not hatched in each electrode shows the contact hole via which the connection with the wiring layer 36 is realized. Reference numeral 37$h$ denotes a contact hole for electrically connecting the n-type electrode 37 and the wiring layer 36 and reference numeral 38$h$ indicates a contact hole for electrically connecting the p-type electrode 38 and the wiring layer 36.

As shown in FIG. 1, ten pn junction diodes 25 are connected in series in each of the protection circuit (Df) having the rectifying characteristic in the forward direction and the protection circuit (Dr) having the rectifying characteristic in the reverse direction. The p-type electrode 38 in the first pn junction diode 25 in the line of pn junction diodes in the protection circuit (Df) having the rectifying characteristic in the forward direction is connected to the wiring layer 36 in the first terminal (collector terminal) of the HBT (Q), and the n-type electrode 37 in the first pn junction diode 25 in the line of the pn junction diodes in the protection circuit (Dr) having the rectifying characteristic in the reverse direction is connected to the wiring layer 36 of the first terminal (collector terminal) of the HBT (Q). The n-type electrode 37 of the final pn junction diode 25 in the line of the pn junction diodes of the protection circuit (Df) having the rectifying characteristic in the forward direction is connected to the wiring layer 36 in the second terminal (emitter terminal) of the HBT (Q), and the p-type electrode 38 of the final pn junction diode 25 in the line of the pn junction diodes of the protection circuit (Dr) having the rectifying characteristic in the reverse direction is connected to the wiring layer 36 in the second terminal (emitter terminal) of the HBT (Q)

As the number (n) of diodes of the protection circuit (Df) having the rectifying characteristic in the forward direction, the number satisfying the following equation is selected.

$$\frac{V_{cc}}{V_f} \leq n \leq \frac{BV_{ceo}}{V_f}$$

where, $V_f$ denotes a first source voltage ($V_{cc}$), $V_f$ indicates a forward ON-state voltage (about 1V) of a single pn junction diode, and $BV_{ceo}$ expresses a collector-emitter breakdown voltage with the base open.

By the protection circuit, therefore, even when an overvoltage is applied, the voltage at the first terminal (collector terminal) of the HBT (Q) is clipped at n×$V_f$ and the clipped voltage is lower than the breakdown voltage ($BV_{ceo}$) of the HBT (Q). Thus, the HBT (Q) can be prevented from being destroyed.

The size of a diode using the pn junction formed by the base and emitter can be made as small as 20×20 $\mu m^2$.

The HBT 1 is formed so that $BV_{ceo}$ is equal to 12V. $V_{cc}$ can be set in a range from 2.7 to 4.2V. In the first embodiment, $V_{cc}$ is set to 3.5V.

A method of manufacturing the semiconductor amplifying device (Amp) with the protection circuit according to the first embodiment will now be described with reference to FIGS. 7 to 11.

Figure 7:
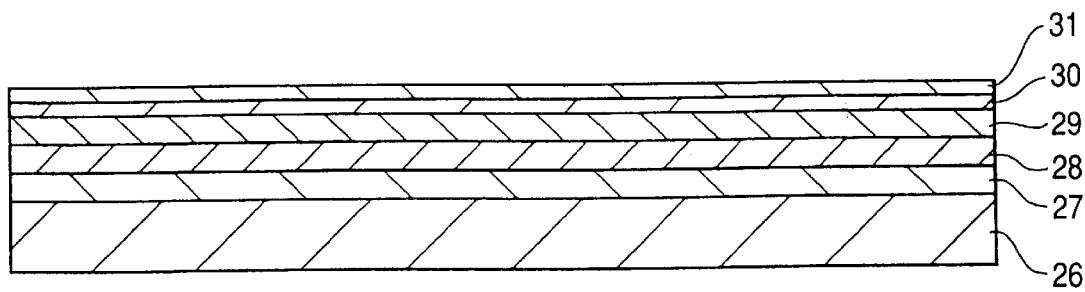
FIG. 7 is a cross section of a semi-insulating GaAs substrate on which multiple semiconductor layers are formed in the manufacture of the HBT with the protection circuit.

As shown in FIG. 7, the semi-insulating GaAs substrate 26 having a thickness of about 600 $\mu m$ is prepared. On the principal face of the semi-insulating GaAs substrate 26, semiconductor layers are sequentially formed by MOCVD (Metalorganic Chemical Vapor Deposition) or gas source MBE (Molecular Beam Epitaxy). The semiconductor layers are the n-type GaAs sub-collector layer 27 made of n+ type GaAs (having concentration of impurity (Si) of about 5×10$^{18}$ cm$^{-3}$ and a thickness of about 600 nm), the n-type GaAs collector layer 28 made of n-type GaAs (having concentration of impurity (Si) of about 10$^{16}$ cm$^{-3}$ and a thickness of about 800 nm), the p-type GaAs base layer 29 made of p$^+$ GaAs (having concentration of impurity (C) of about 4×10$^{19}$ to 1×10$^{20}$ cm$^{-3}$ and a thickness of about 50 nm), the n-type InGaP/GaAs emitter layer 30 formed by depositing n-type InGaP on the base layer and then n-type GaAs (having concentration of impurity (Si) of 3×10$^{17}$ cm$^{-3}$ and a thickness of InGaP of about 30 nm and a thickness of GaAs of about 200 nm) and the InGaAs cap layer 31 made of InGaAs (having a thickness of about 300 nm).

Figure 8:
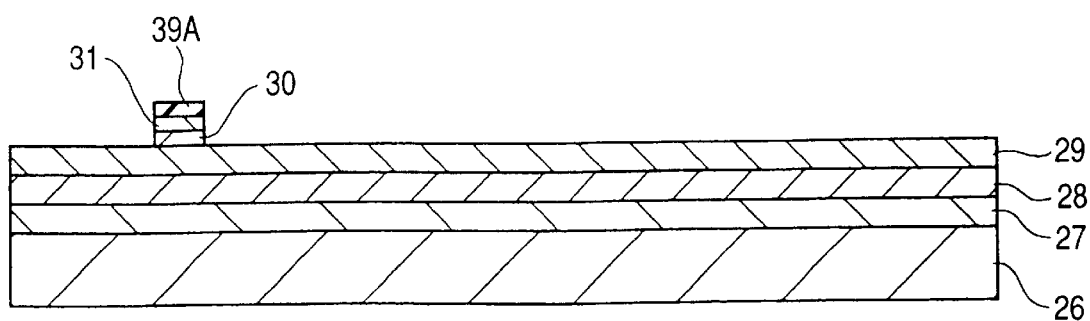
FIG. 8 is a cross section of a substrate on which an emitter layer and the like of the HBT are formed by selectively etching an uppermost InGaAs cap layer of the multiple semiconductor layers and an n-type InGaP/GaAs emitter layer under the cap layer.

Subsequently, the mesa structure of the pn junction diode portion for each of the HBT (Q) and the protection circuit (D) is formed by a photoresist process and an etching process (wet etching, dry etching, or the like). Specifically, as shown in FIG. 8, an etching mask 39a is formed by selectively etching a photoresist film formed on the InGaAs cap layer 31. After that, by using the etching mask 39a as a mask, the InGaAs cap layer 31 and the n-type InGaP/GaAs emitter layer 30 are etched, thereby forming an emitter layer portion of the HBT (Q). The diagram shows only the portion for forming the semiconductor amplifying device (Amp) with a single protection circuit.

Figure 9:
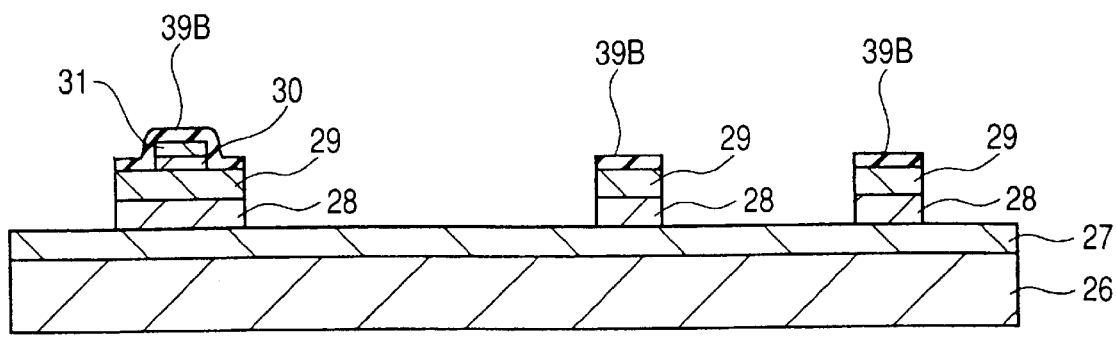
FIG. 9 is a cross section of a substrate on which a base layer, a collector layer, and a pn junction diode of the HBT are formed by selectively etching a p-type GaAs base layer under the n-type InGaP/GaAs emitter layer and an n-type GaAs collector layer under the p-type GaAs base layer.

After removing the etching mask 39a, as shown in FIG. 9, an etching mask 39b is formed by the above-described means on a part of the portion extending from the InGaAs cap layer 31 to the p-type GaAs base layer 29 and on the p-type GaAs base layer 29 for forming the pn junction diode 25 apart from the portion. By using the etching mask 39b as a mask, the p-type GaAs base layer 29 and the n-type GaAs collector layer 28 are etched, thereby forming the base layer portion of the HBT (Q) and the p-type semiconductor layer in the pn junction diode 25. In the first embodiment, two lines each comprised of ten p-type semiconductor layers are provided.

Figure 10:
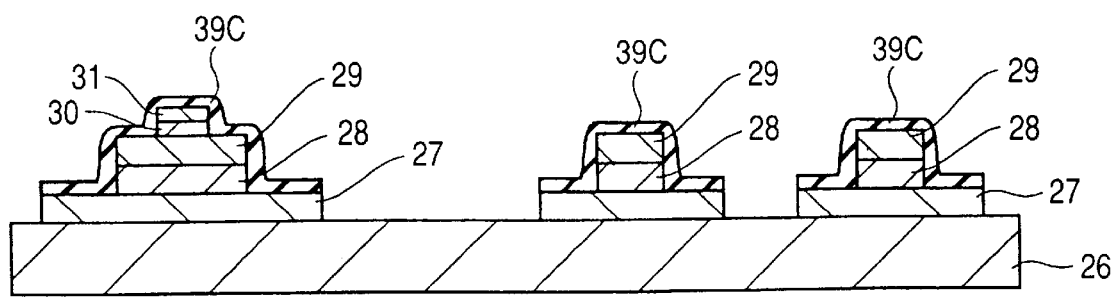
FIG. 10 is a cross section of a substrate obtained by selectively etching an n-type GaAs sub-collector layer as the lowest layer on the semi-insulating GaAs substrate.

As shown in FIG. 10, after removing the etching mask 39b, an etching mask 39c is formed by the above-described means on a part extending from the InGaAs cap layer 31 and the p-type GaAs base layer 29 to the n-type GaAs sub-collector layer 27, and on a part extending from the p-type GaAs base layer 29 to the n-type GaAs sub-collector layer 27. By using the etching mask 39c as a mask, the n-type GaAs sub-collector layer 27 is etched, thereby forming the collector layer portion of the HBT (Q) and the n-type semiconductor layer of the pn junction diode 25.

Figure 11:
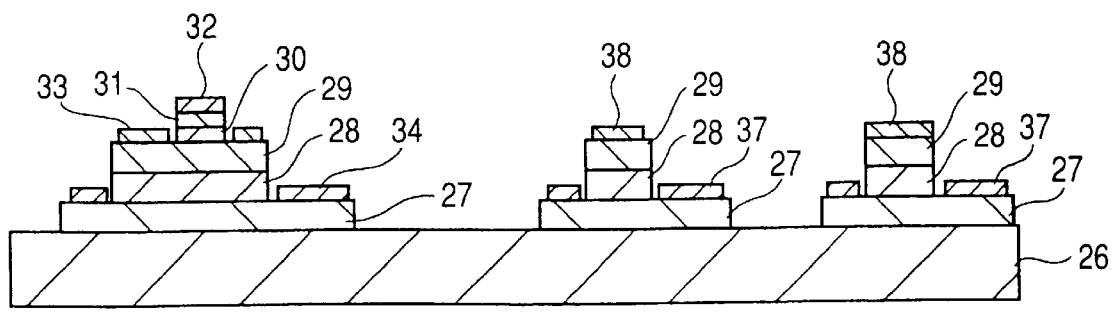
FIG. 11 is a cross section of the substrate on which an emitter electrode, a base electrode, and a collector electrode are formed.

After removing the etching mask 39c, while sequentially changing the process, predetermined electrodes are formed as shown in FIG. 11. For example, as the emitter electrode 32, a WSi alloy layer is formed on the InGaAs cap layer 31 by the photoresist process and the dry etching process. Since a non-alloy ohmic contact is formed in this case, a heat treatment process is unnecessary.

On the p-type GaAs base layer 29 exposed apart from the n-type InGaP/GaAs emitter layer 30, a Pt/Ti/Au alloy layer is selectively formed by a lift-off method, thereby obtaining the base electrode 33. The base electrode 33 is subjected to heat treatment so as to form the ohmic contact.

On the n-type GaAs sub-collector layer 27 exposed apart from the n-type GaAs collector layer 28, an AuGe/Ni/Au alloy layer is selectively formed by the lift-off method and is subjected to heat treatment, thereby forming the collector electrode 34 which serves as an ohmic contact.

The p-type electrode 38 in the pn junction diode 25 is formed simultaneously with the formation of the base electrode. The n-type electrode 37 in the pn junction diode 25 is formed simultaneously with the formation of the collector electrode.

Subsequently, the insulating film 35 is formed on the whole principal face of the semi-insulating GaAs substrate 26, and the contact holes are formed by selectively etching the insulating film 35. After that, the metal film which will become the wiring layer is formed on the whole principal face of the semi-insulating GaAs substrate 26 and is selectively removed by etching, thereby forming the wiring layer 36 as shown in FIGS. 1 to 3 and FIG. 6.

Finally, the semi-insulating GaAs substrate 26 is diced into chips, thereby forming the semiconductor amplifying devices (Amp) each with the protection circuit.

The first embodiment produces the following effects.

(1) In the semiconductor amplifying device with the protection circuit in the RF power amplifier module, between the first terminal (collector terminal) connected to the output terminal (Pout) and the second terminal (emitter terminal), the first protection circuit (Df) having the rectifying characteristic in the forward direction in accordance with the voltage at the collector terminal and the second protection circuit (Dr) which displays the rectifying characteristic in the reverse direction when the first protection circuit displays the rectifying characteristic in the forward direction are provided.

Each of the protection circuits has the configuration in which (n) pn junction diodes are connected in series. The (n) pn junction diodes connected in series effectively have the diode characteristic of an ON-state voltage ($=n \times V_f$). Consequently, even when an overvoltage is applied across the collector and the emitter, the collector terminal is clamped at the ON-state voltage ($=n \times V_f$). Therefore, even when a standing wave occurs due to fluctuations in the load impedance matching conditions of the RF power amplifier module or a portable telephone in which the RF power amplifier module is assembled and an overvoltage is generated at an output terminal, because of the voltage clamping effect produced by connecting the pn junction diodes in series, the HBT can be prevented from being destroyed. In other words, even if the user touches the antenna of a portable telephone (wireless communication apparatus), the HBT in the built-in RF power amplifier module is not destroyed. That is, the HBT is prevented from being destroyed even by fluctuations in the load circuit including an antenna, a duplexer, and the like.

(2) Even if an overvoltage is applied across the collector and emitter of the HBT due to an incidental erroneous contact of the operator at the time of manufacturing a portable telephone or an RF power amplifier module, the HBT is not damaged.

(3) Even when the protection circuit is provided, the pn junction diode can be formed relatively small, and the size of the semiconductor amplifying device (Amp) with the protection circuit is not so increased. Thus, the small size of the RF power amplifier module and the portable telephone can be attained.

(4) Since the transistor assembled in the RF power amplifier module is a heterojunction bipolar transistor made of GaAs, the source voltage lower than 5V can be set.

SECOND EMBODIMENT

Figure 17:
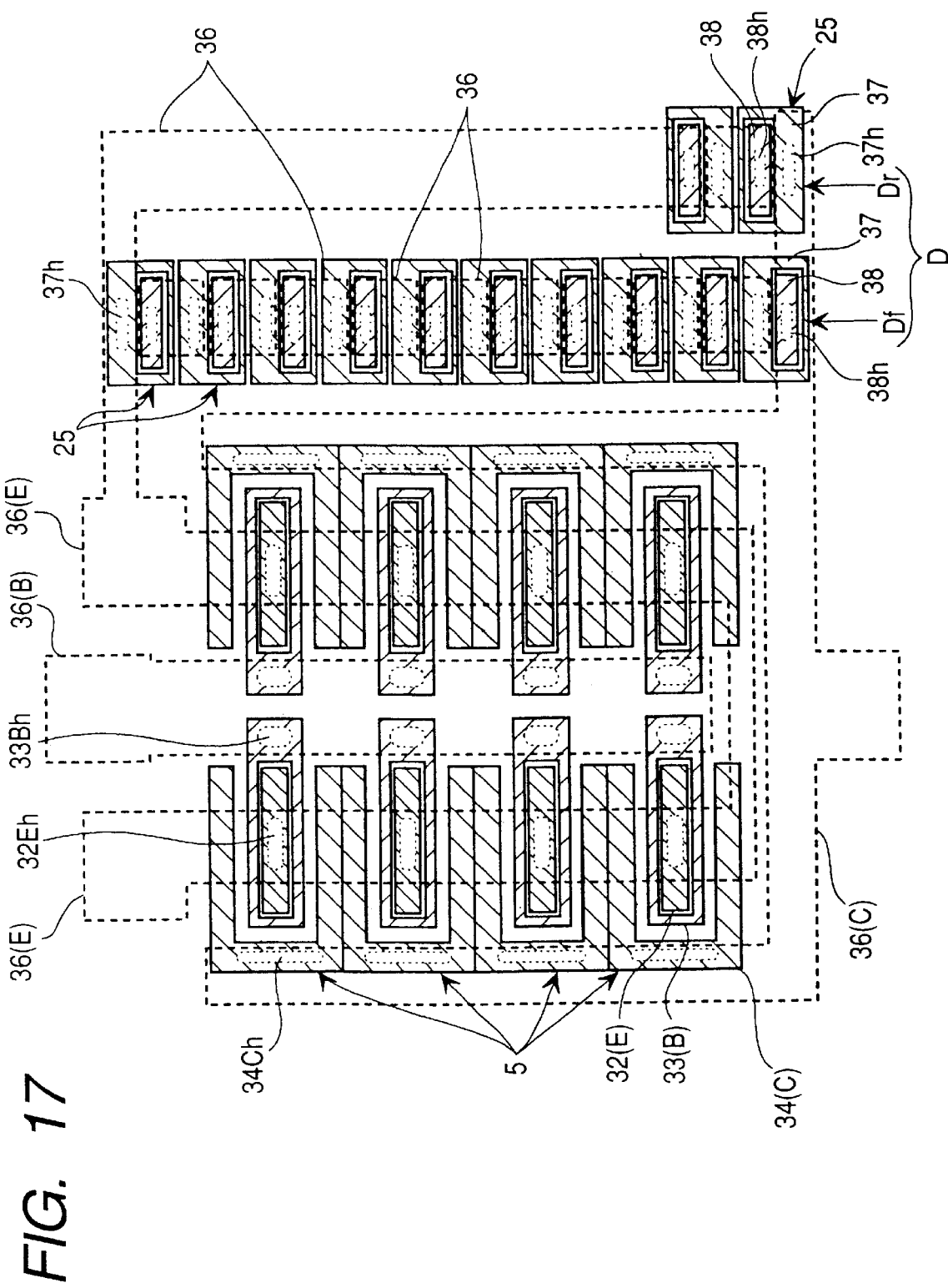
FIG. 17 is a schematic plan view showing a multi-finger pattern of an HBT with a protection circuit in an RF power amplifier module according to another embodiment (second embodiment) of the invention.

FIG. 17 is a schematic plan view showing a multi-finger pattern of an HBT with a protection circuit in an RF power amplifier module according to another embodiment (second embodiment) of the invention. In the second embodiment, the protection circuit (Dr) having the rectifying characteristic in the reverse direction has the pn junction diodes 25 of the number which is smaller than that in the case of the protection circuit (Df) having the rectifying characteristic in the forward direction and is set to two. This structure is created on the basis of the idea such that noise in the reverse direction is smaller than that in the forward direction. With the structure, the size of the semiconductor amplifying device (Amp) with the protection circuit can be reduced.

THIRD EMBODIMENT

Figure 18:
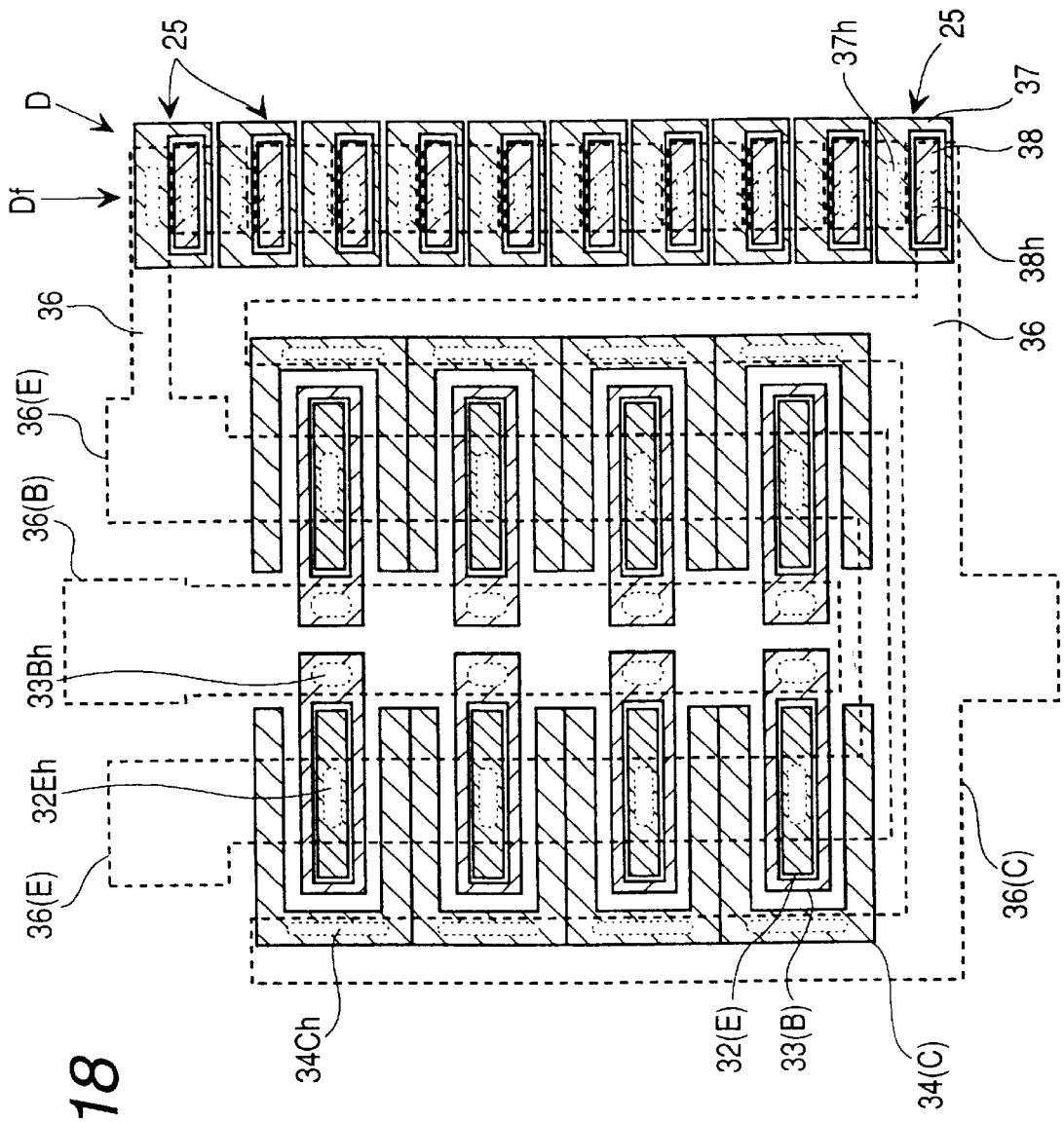
FIG. 18 is a schematic plan view showing a multi-finger pattern of an HBT with a protection circuit in an RF power amplifier module according to another embodiment (third embodiment) of the invention.

FIG. 18 is a schematic plan view showing a multi-finger pattern of an HBT with a protection circuit in an RF power amplifier module according to another embodiment (third embodiment) of the invention. In the third embodiment, the protection circuit (D) is constructed only by the protection circuit (Df) having the rectifying characteristic in the reverse direction. This configuration can be used in the case where noise in the reverse direction does not have to be considered. With the configuration, the size of the semiconductor amplifying device (Amp) with a protection circuit can be reduced.

FOURTH EMBODIMENT

Figure 19:
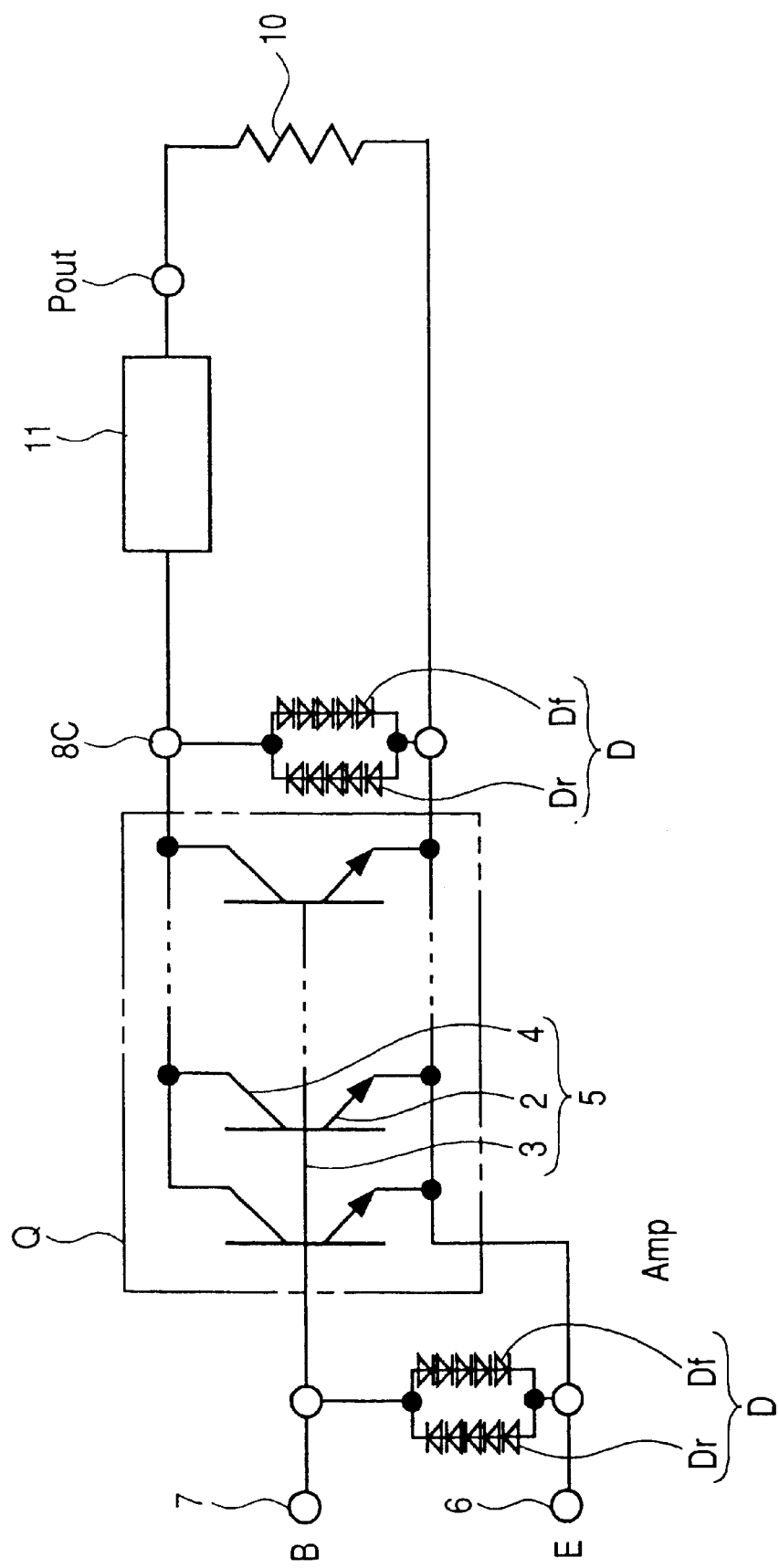
FIG. 19 is a diagram of an equivalent circuit including an HBT with a protection circuit in an RF power amplifier module according to another embodiment (fourth embodiment) of the invention.
Figure 20:
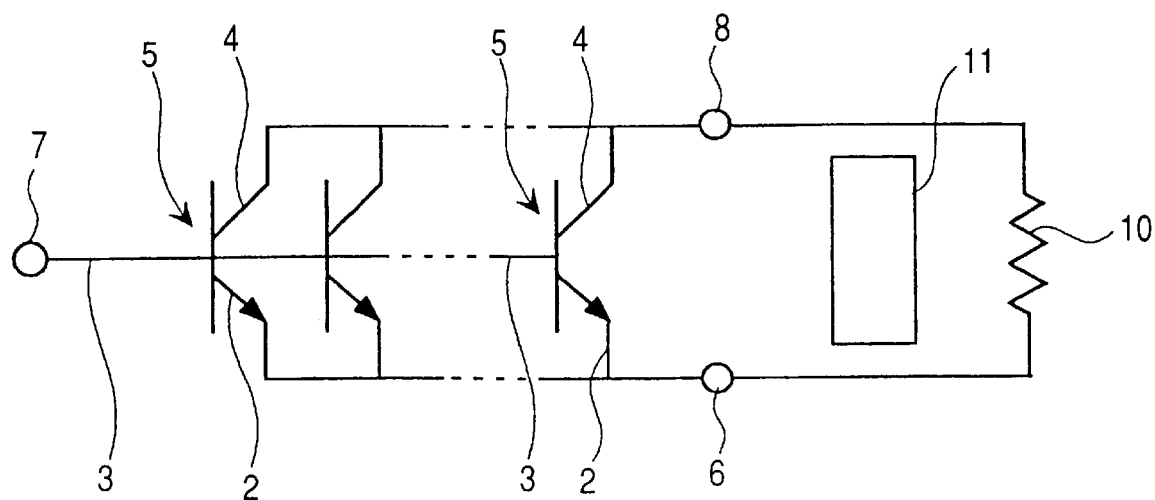
FIG. 20 is a diagram showing a power amplifier circuit constructed by using a conventional HBT.
Figure 21:
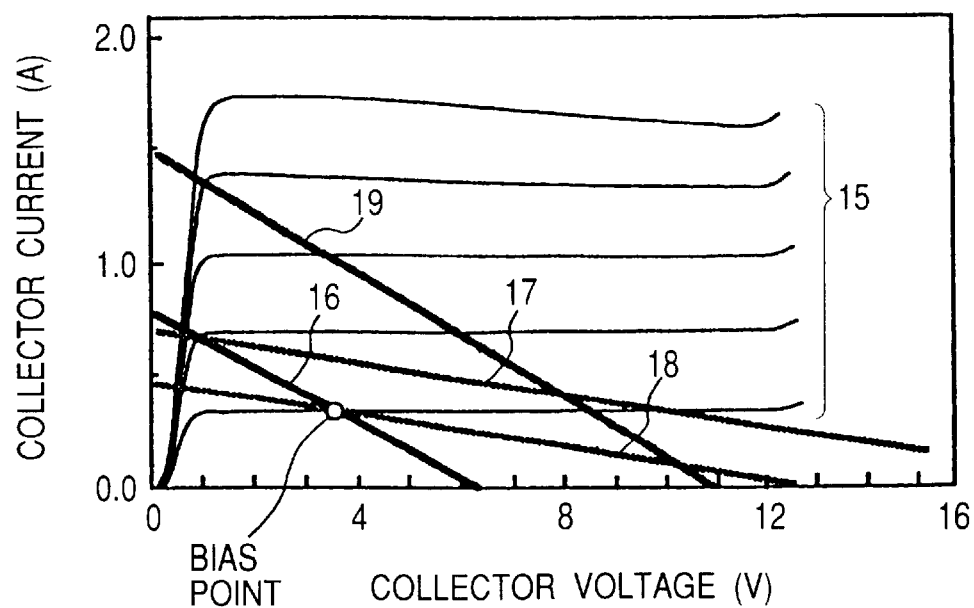
FIG. 21 is a graph showing the correlation between the static characteristic of the HBT and load lines.

FIG. 19 is a diagram showing an equivalent circuit including an HBT with a protection circuit in an RF power amplifier module according to further another embodiment (fourth embodiment) of the invention. The fourth embodiment is directed at preventing a semiconductor amplifying device such as an HBT from being destroyed when the operator touches the device by mistake in the manufacture of an RF power amplifier module or a portable telephone (wireless communication apparatus). As shown in FIG. 19, a protection circuit (D) is inserted between a first terminal (collector terminal) and a second terminal (emitter terminal) of an HBT (Q), and a protection circuit (D) is also inserted between a control terminal (base terminal) and a second terminal (emitter terminal).

FIG. 19 shows a circuit in which a protection circuit (Df, a third protection circuit) having the rectifying characteristic in the forward direction and a protection circuit (Dr, a fourth protection circuit) having the rectifying characteristic in the reverse direction are assembled in parallel with each other also between the base terminal and the emitter terminal in the equivalent circuit of FIG. 4 in the first embodiment. In FIG. 19, the number of the pn junction diodes 25 arranged in series is five in each of the protection circuit (Df) having the rectifying characteristic in the forward direction and the protection circuit (Dr) having the rectifying characteristic in the reverse direction in each protection circuit (D). The number, however, is not limited to five but can be any number as long as it satisfies the expression of the first embodiment. The number of pn junction diodes 25 of the protection circuit (Dr) having the rectifying characteristic in the reverse direction may be equal to or lower than the number of pn junction diodes 25 of the protection circuit (Df) having the rectifying characteristic in the forward direction as described in the second embodiment.

In the fourth embodiment, even if the operator touches the terminal portion or antenna portion by mistake at the time of manufacturing (assembling) the RF power amplifier module or at the time of manufacturing (assembling) the portable telephone (wireless communication apparatus), the potential of the collector terminal and the base terminal is clamped by the protection circuit (D). Consequently, the HBT (Q) is not damaged by the application of an overvoltage caused by the contact of the operator. Thus, the improved manufacturing yield of the RF power amplifier module and portable telephone can be achieved, and the manufacturing costs of the RF power amplifier module and portable telephone can be reduced.

Although the invention achieved by the inventor herein has been concretely described above on the basis of the embodiments, obviously, the invention is not limited to the embodiments but can be variously modified without departing from the gist. Although the amplifier having the two-stage configuration of the first semiconductor amplifying device and the final semiconductor amplifying device has been described in the foregoing embodiments, the invention can be also applied to the configuration in which one or more intermediate semiconductor amplifying devices are cascaded between the first semiconductor amplifying device and the final semiconductor amplifying device. In this case, a protection circuit having any of the configurations described in the foregoing embodiments is inserted between the first terminal (collector terminal) and the second terminal (emitter terminal) of the intermediate semiconductor amplifying device, and a protection circuit having any of the configurations is inserted between the control terminal (base terminal) and the second terminal (emitter terminal) thereby enabling the HBT from being destroyed by fluctuations in load impedance or contact of the operator as in the foregoing embodiments.

The intermediate semiconductor amplifying device has a configuration such that its control terminal is connected to the first terminal of the preceding semiconductor amplifying device and the bias supply terminal, a signal corresponding to the signal output from the first terminal of the preceding semiconductor amplifying device is supplied, a bias at a predetermined level is supplied from the bias supply terminal, its first terminal is connected to both the first power source terminal and the control terminal of the semiconductor amplifying device at the post stage, and its second terminal is connected to the second power source terminal.

Although the case of using the HBT as the semiconductor amplifying device has been described in the foregoing embodiments, effects similar to those of the foregoing embodiments can be produced also when a high electron mobility transistor (HEMT) made of a compound semiconductor, a field-effect transistor made of a silicon semiconductor, an MESFET made of a compound semiconductor, or the like is used.

The RF power amplifier module of the invention has the following configuration.

A high frequency power amplifier module has:

an input terminal;

an output terminal;

a first transistor having a control terminal for receiving a signal from the input terminal and a first terminal for supplying a signal according to the signal supplied to the control terminal to the output terminal; and a first protection circuit connected to the first terminal of the first transistor. The first protection circuit has a plurality of pn junction semiconductor devices connected in series.

The high frequency power amplifier module further includes a second protection circuit connected to the first terminal, the second protection circuit has a plurality of pn junction semiconductor devices connected in series, and a rectifying characteristic of the plurality of pn junction semiconductor devices connected in series is opposite to that of the plurality of pn junction semiconductor devices connected in series in the first protection circuit.

The high frequency power amplifier module further includes:

a first voltage terminal;

a second voltage terminal; and a bias circuit connected between the first voltage terminal and the first terminal, and the first protection circuit is connected between the first terminal and the second voltage terminal.

The second protection circuit is connected between the first terminal and the second voltage terminal.

The first and second protection circuits clamp a voltage at the first terminal by the plurality of pn junction semiconductor devices connected in series.

In such an RF power amplifier module as well, by the clamping effect of the first and second protection circuits connected to the first terminal of the first transistor, the HBT destruction caused by fluctuations in load and the HBT destruction due to an overvoltage incidentally applied at the time of manufacturing the RF power module can be prevented.

Although the case where the invention achieved by the inventor herein is applied to a portable telephone in the field of utilization as the background of the invention has been described above, the invention is not limited to the portable telephone but can be applied to other wireless communication apparatuses.

The invention can be applied to a module having at least an amplification circuit and a wireless communication apparatus in which the module is assembled.

Industrial Applicability

As described above, the RF power amplifier module according to the invention can be used as the power amplifier of various wireless communication apparatuses such as a portable telephone as a mobile communication terminal. The wireless communication apparatus by which stable speech communication can be performed is provided. Further, because of improved manufacturing yield of the RF power amplifier module and the wireless communication apparatus, the manufacturing cost of the RF power amplifier module and that of the wireless communication apparatus can be reduced.

What is claimed is:

1. A high frequency power amplifier module comprising:

an input terminal;

an output terminal;

a first voltage terminal;

a second voltage terminal;

a bias supply terminal;

a first semiconductor amplifying device having a control terminal connected to the input terminal and the bias supply terminal, a first terminal connected to the first voltage terminal, and a second terminal connected to the second voltage terminal, for supplying a signal according to a signal supplied to the input terminal from the first terminal to the output terminal; and a first protection circuit including a plurality of devices which are coupled between the first terminal and a predetermined voltage node in series so as to have a rectifying characteristic in a forward direction in accordance with a voltage at the first terminal, each of which is different from a parasitic device existing in the first semiconductor amplifying device, and each of which is formed on a semiconductor substrate with the first semiconductor amplifying device.

2. The high frequency power amplifier module according to claim 1, further comprising a second protection circuit which is a device different from the parasitic device existing in the first semiconductor amplifying device, connected to the first terminal, and has a rectifying characteristic in the reverse direction when the first protection circuit displays the rectifying characteristic in the forward direction.

3. The high frequency power amplifier module according to claim 1, further comprising a third protection circuit which is a device different from the parasitic device existing in the semiconductor amplifying device, connected to the control terminal, and has the rectifying characteristic in the forward direction in accordance with a voltage in the control terminal.

4. The high frequency power amplifier module according to claim 3, further comprising a fourth protection circuit which is a device different from the parasitic device existing in the semiconductor amplifying device, connected to the control terminal, and has the rectifying characteristic in the reverse direction when the third protection circuit displays the rectifying characteristic.

5. The high frequency power amplifier module according to claim 1,
wherein one or more second semiconductor amplifying devices are cascaded between the input terminal and the first semiconductor amplifying device,
wherein the second semiconductor amplifying device has a control terminal which is connected to the input terminal and the bias supply terminal and outputs a signal according to a signal from the input terminal, a first terminal connected to the first voltage terminal, and a second terminal connected to the second voltage terminal, and
wherein a protection circuit is provided for the first terminal and/or the control terminal of the second semiconductor amplifying device.

6. The high frequency power amplifier module according to claim 1, wherein each of the protection circuits is constructed by arranging a plurality of diodes in series.

7. The high frequency power amplifier module according to claim 1, wherein a bias voltage of the first and third protection circuits is lower than a breakdown voltage between the first and second terminals with the control terminal open and is higher than a first source voltage applied to the first voltage terminal.

8. The high frequency power amplifier module according to claim 1, wherein the protection circuit is constructed by a part of a plurality of semiconductor layers provided on a semiconductor substrate to form the semiconductor amplifying device.

9. The high frequency power amplifier module according to claim 1, wherein the semiconductor amplifying device is formed by using a heterojunction bipolar transistor made of a compound semiconductor.

10. The high frequency power amplifier module according to claim 9, wherein the heterojunction bipolar transistor has a multi-finger structure.

11. The high frequency power amplifier module according to claim 1, wherein the heterojunction bipolar transistor is of an npn type, the number (n) of diodes in each of the first and third protection circuits satisfies the following numerical expression:

$$\frac{V_{cc}}{V_f} \leq n \leq \frac{BV_{ceo}}{V_f}$$

where $V_{cc}$ denotes a first source voltage, $V_f$ indicates a forward ON-state voltage of a single pn junction diode, and $BV_{ceo}$ expresses a collector-emitter breakdown voltage with a base open.

12. The high frequency power amplifier module according to claim 1, wherein the semiconductor amplifying device is formed by using a high electron mobility transistor made of a compound semiconductor.

13. The high frequency power amplifier module according to claim 1, wherein the semiconductor amplifying device is formed by using a field-effect transistor made of a silicon semiconductor.

14. The high frequency power amplifier module according to claim 1, wherein the semiconductor amplifying device is formed by using an MESFET made of a compound semiconductor.

15. A wireless communication apparatus comprising:
an antennae; and
a high frequency power amplifying module connected to the antenna,
the high frequency power amplifying module comprising:
an input terminal;
an output terminal;
a first voltage terminal:
a second voltage terminal;
a bias supply terminal;
a first semiconductor amplifying device having a control terminal connected to the input terminal and the bias supply terminal, a first terminal connected to the first voltage terminal, and a second terminal connected to the second voltage terminal, for supplying a signal according to a signal supplied to the input terminal from the first terminal to the output terminal; and
a first protection circuit including a plurality of devices which are coupled between the first terminal and a predetermined voltage node in series so as to have a rectifying characteristic in a forward direction in accordance with a voltage at the first terminal, each of which is different from a parasitic device existing in the first semiconductor amplifying device, and each of which is formed on a semiconductor substrate with the first semiconductor amplifying device.

16. The wireless communication apparatus according to claim 15, further comprising a second protection circuit which is a device different from the parasitic device existing in the first semiconductor amplifying device, connected to the first terminal, and has a rectifying characteristic in the reverse direction when the first protection circuit displays the rectifying characteristic in the forward direction.

17. The wireless communication apparatus according to claim 15, further comprising a third protection circuit which is a device different from the parasitic device existing in the semiconductor amplifying device, connected to the control terminal, and has the rectifying characteristic in the forward direction in accordance with a voltage in the control terminal.

18. The wireless communication apparatus according to claim 17, further comprising a fourth protection circuit which is a device different from the parasitic device existing in the semiconductor amplifying device, connected to the control terminal, and has the rectifying characteristic in the reverse direction when the third protection circuit displays the rectifying characteristic.

19. The wireless communication apparatus according to claim 15,
wherein one or more second semiconductor amplifying devices are cascaded between the input terminal and the first semiconductor amplifying device,
wherein the second semiconductor amplifying device has a control terminal which is connected to the input terminal and the bias supply terminal and outputs a signal according to a signal from the input terminal, a first terminal connected to the first voltage terminal, and a second terminal connected to the second voltage terminal, and
wherein a protection circuit is provided for the first terminal and/or the control terminal of the second semiconductor amplifying device.

20. The wireless communication apparatus according to claim 15, wherein each of the protection circuits is constructed by arranging a plurality of diodes in series.

21. The wireless communication apparatus according to claim 15, wherein a bias voltage of the first and third protection circuits is lower than a breakdown voltage between first and second terminals with the control terminal open and is higher than a first source voltage applied to the first voltage terminal.

22. The wireless communication apparatus according to claim 15, wherein the protection circuit is constructed by a part of a plurality of semiconductor layers provided on a semiconductor substrate to form the semiconductor amplifying device.

23. The wireless communication apparatus according to claim 15, wherein the semiconductor amplifying device is formed by using a heterojunction bipolar transistor made of a compound semiconductor.

24. The wireless communication apparatus according to claim 23, wherein the heterojunction bipolar transistor has a multi-finger structure.

25. The wireless communication apparatus according to claim 15, wherein the heterojunction bipolar transistor is of an npn type, the number (n) of diodes in each of the first to third protection circuits satisfies the following numerical expression:

$$\frac{V_{cc}}{V_f} \leq n \leq \frac{BV_{ceo}}{V_f}$$

where $V_{cc}$ denotes a first source voltage, $V_f$ indicates a forward ON-state voltage of a single pn junction diode, and $BV_{ceo}$ expresses a breakdown voltage between a collector and an emitter with a base open.

26. The wireless communication apparatus according to claim 15, wherein the semiconductor amplifying device is formed by using a high electron mobility transistor made of a compound semiconductor.

27. The wireless communication apparatus according to claim 15, wherein the semiconductor amplifying device is formed by using a field-effect transistor made of a silicon semiconductor.

28. The wireless communication apparatus according to claim 15, wherein the semiconductor amplifying device is formed by using an MESFET made of a compound semiconductor.

29. A high frequency power amplifier module comprising:
an input terminal;
an output terminal;
a first transistor having a control terminal for receiving a signal from the input terminal and a first terminal for supplying a signal according to the signal supplied to the control terminal to the output terminal; and
a first protection circuit connected to the first terminal of the first transistor,
wherein the first protection circuit has a plurality of pn junction semiconductor devices coupled between the first terminal and a predetermined voltage node in series, and wherein the plurality of pn junction semiconductor devices are formed on a semiconductor substrate with the first transistor.

30. The high frequency power amplifier module according to claim 29, further comprising a second protection circuit connected to the first terminal,
wherein the second protection circuit has a plurality of pn junction semiconductor devices connected in series, and
wherein a rectifying characteristic of the plurality of pn junction semiconductor devices connected in series is opposite to that of the plurality of pn junction semiconductor devices connected in series in the first protection circuit.

31. The high frequency power amplifier module according to claim 30, further comprising:
a first voltage terminal;
a second voltage terminal;
a bias circuit connected between the first voltage terminal and the first terminal,
wherein the first protection circuit is connected between the first terminal and the second voltage terminal.

32. The high frequency power amplifier module according to claim 31, wherein the second protection circuit is connected between the first terminal and the second voltage terminal.

33. The high frequency power amplifier module according to claim 32, wherein the first and second protection circuits clamp a voltage at the first terminal by the plurality of pn junction semiconductor devices connected in series.

34. A high frequency power amplifier module comprising:
an input terminal;
an output terminal to be coupled to an antenna;
a first semiconductor amplifying device having a control terminal coupled to the input terminal and the first terminal coupled to the output terminal, and providing an output signal according to a signal supplied to the input terminal to the output terminal; and
a first protection circuit coupled between the first terminal of the first semiconductor amplifying device and a predetermined voltage node and including a plurality of devices which are coupled between the first terminal and the predetermined voltage node in series so as to have a rectifying characteristic in a reverse direction for a voltage at the first terminal, each of which is different from a parasitic device existing in the first semiconductor amplifying device and each of which is formed on a semiconductor substrate with the first semiconductor amplifying device.

35. A high frequency power amplifier module according to claim 34, wherein the first semiconductor amplifying device is an HBT (heterojunction bipolar transistor) having a multi-finger pattern.

36. A high frequency power amplifier module according to claim 35, wherein each of the plurality of devices includes an HBT having a control terminal coupled to a first terminal and a second terminal.

37. A high frequency power amplifier module according to claim 34, further comprising:
a second semiconductor amplifying device having a control terminal coupled to the input terminal and a first terminal for providing an output signal according to a signal supplied to the control terminal thereof;
a coupling circuit coupled between the first terminal of the second semiconductor amplifying device and the control terminal of the first semiconductor amplifying device; and
a second protection circuit coupled between the first terminal of the second amplifying device and a predetermined voltage node and including a plurality of devices which are coupled between the first terminal and the predetermined voltage node in series so as to have a rectifying characteristic in a reverse direction for a voltage at the first terminal, each of which is different from a parasitic device existing in the second semiconductor amplifying device and each of which is formed on a semiconductor substrate with the second semiconductor amplifying device.

38. A high frequency power amplifier module according to claim 37, wherein each of the first semiconductor amplifying device and the second semiconductor amplifying device is an HBT (heterojunction bipolar transistor) having a multi-finger pattern.

39. A high frequency power amplifier module according to claim 38, wherein each of the plurality of devices included in the first protection circuit includes an HBT having a control terminal coupled to a first terminal and a second terminal and each of the plurality of devices included in the second protection circuit includes an HBT having a control terminal coupled to a first terminal and a second terminal.

* * * * *